United States Patent
Meuris et al.

(10) Patent No.: US 10,978,601 B2
(45) Date of Patent: Apr. 13, 2021

(54) PARTIALLY TRANSLUCENT PHOTOVOLTAIC MODULES AND METHODS FOR MANUFACTURING

(71) Applicants: IMEC VZW, Leuven (BE); Universiteit Hasselt, Hasselt (BE)

(72) Inventors: Marc Meuris, Keerbergen (BE); Tom Borgers, Leuven (BE); Bart Onsia, Schaarbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/481,605

(22) PCT Filed: Feb. 5, 2018

(86) PCT No.: PCT/EP2018/052838
§ 371 (c)(1),
(2) Date: Jul. 29, 2019

(87) PCT Pub. No.: WO2018/141976
PCT Pub. Date: Aug. 9, 2018

(65) Prior Publication Data
US 2020/0006585 A1    Jan. 2, 2020

(30) Foreign Application Priority Data
Feb. 6, 2017    (EP) ..................................... 17154742

(51) Int. Cl.
*H01L 31/05*    (2014.01)
*H01L 31/0468*    (2014.01)
*H01L 31/18*    (2006.01)

(52) U.S. Cl.
CPC .......... *H01L 31/05* (2013.01); *H01L 31/0468* (2014.12); *H01L 31/186* (2013.01)

(58) Field of Classification Search
CPC .... H01L 31/05; H01L 31/0468; H01L 31/186
See application file for complete search history.

(56) References Cited

U.S. PATENT DOCUMENTS 4,590,327 A * 5/1986 Nath ............... H01L 31/022433
  136/256
4,633,033 A * 12/1986 Nath ............... H01L 31/022425
  136/256

(Continued)

FOREIGN PATENT DOCUMENTS

DE    102008043833 A1    5/2010
EP        2660878 A1    11/2013

OTHER PUBLICATIONS

PCT International Search Report and Written Opinion, PCT International Application No. PCT/EP2018/052838, dated May 4, 2018, 16 pages.

*Primary Examiner* — Golam Mowla
(74) *Attorney, Agent, or Firm* — McDonnell Boehnen Hulbert & Berghoff LLP

(57) ABSTRACT

Example embodiments relate to partially translucent photovoltaic modules and methods for manufacturing partially translucent photovoltaic modules. One embodiment includes a method for electrically interconnecting a plurality of thin-film photovoltaic plates. The method includes positioning a plurality of thin-film photovoltaic plates side by side. The thin-film photovoltaic plates are partially translucent or non-translucent. The method also includes providing at least one connection element on a surface of each of the plurality of thin-film photovoltaic plates. The at least one connection element includes a plurality of electrically conductive wires arranged in a grid structure. Further, the method includes physically separating each connection element into a first connection part that includes a plurality of first electrically interconnected, conductive wires and a second connection part that includes a plurality of second electrically interconnected, conductive wires. In addition, the method includes providing busbars and forming electrical busbar connections.

15 Claims, 14 Drawing Sheets

(56) References Cited

U.S. PATENT DOCUMENTS

| | | | | |
|---|---|---|---|---|
| 5,707,459 A * | 1/1998 | Itoyama | H01L 31/048 | 136/251 |
| 6,175,075 B1 * | 1/2001 | Shiotsuka | B32B 17/04 | 136/244 |
| 6,545,211 B1 * | 4/2003 | Mimura | H02S 40/32 | 136/244 |
| 6,966,184 B2 * | 11/2005 | Toyomura | H02J 3/381 | 60/641.8 |
| 8,551,803 B2 * | 10/2013 | Yuuki | H01L 31/048 | 438/64 |
| 8,569,613 B1 * | 10/2013 | Brown | H01L 31/0504 | 136/256 |
| 10,209,600 B2 * | 2/2019 | Guimard | C03C 17/38 | |
| 2002/0038663 A1 * | 4/2002 | Zenko | H01L 31/048 | 136/244 |
| 2005/0103376 A1 * | 5/2005 | Matsushita | H01L 31/048 | 136/251 |
| 2005/0133083 A1 * | 6/2005 | Matsushita | H01L 31/02013 | 136/251 |
| 2007/0099330 A1 * | 5/2007 | Kodas | H05K 3/105 | 438/64 |
| 2007/0186968 A1 * | 8/2007 | Nakauchi | H01L 31/0747 | 136/244 |
| 2008/0276981 A1 * | 11/2008 | Kinoshita | H01L 31/0747 | 136/244 |
| 2009/0139570 A1 * | 6/2009 | Kinoshita | H01L 31/03762 | 136/256 |
| 2009/0229596 A1 * | 9/2009 | Shin | H02S 40/36 | 126/569 |
| 2010/0275964 A1 * | 11/2010 | Kinoshita | H01L 31/0516 | 136/244 |
| 2011/0220168 A1 * | 9/2011 | Park | H01L 31/02168 | 136/244 |
| 2011/0290296 A1 | 12/2011 | Daniel et al. | | |
| 2012/0167982 A1 * | 7/2012 | Fujishima | H01L 31/022475 | 136/256 |
| 2014/0144482 A1 * | 5/2014 | Ishimaru | H01L 31/0512 | 136/244 |
| 2015/0340529 A1 | 11/2015 | Gillot et al. | | |
| 2016/0322526 A1 | 11/2016 | Kuhn et al. | | |
| 2016/0343894 A1 * | 11/2016 | Shim | H01L 31/05 | |

* cited by examiner

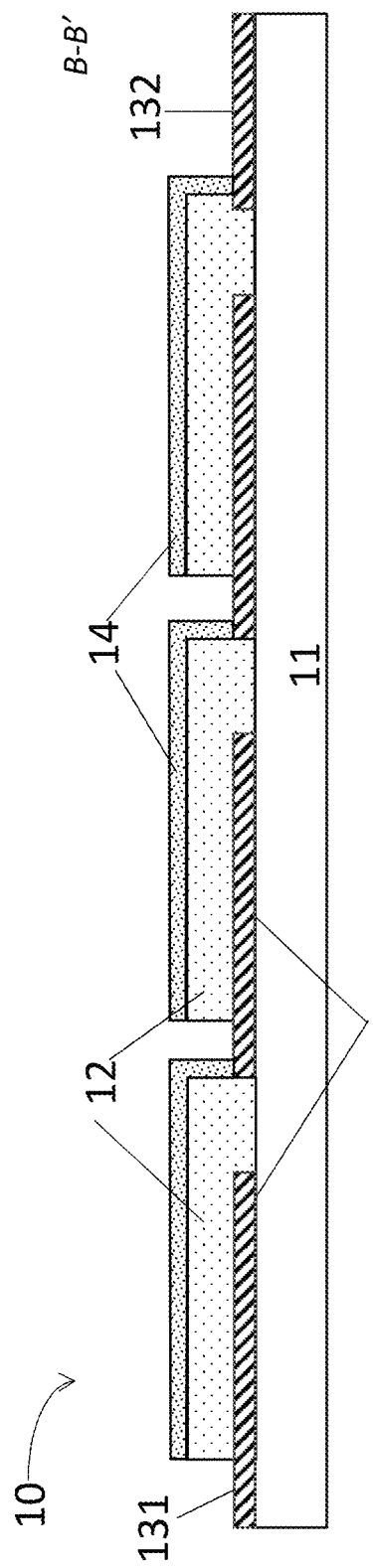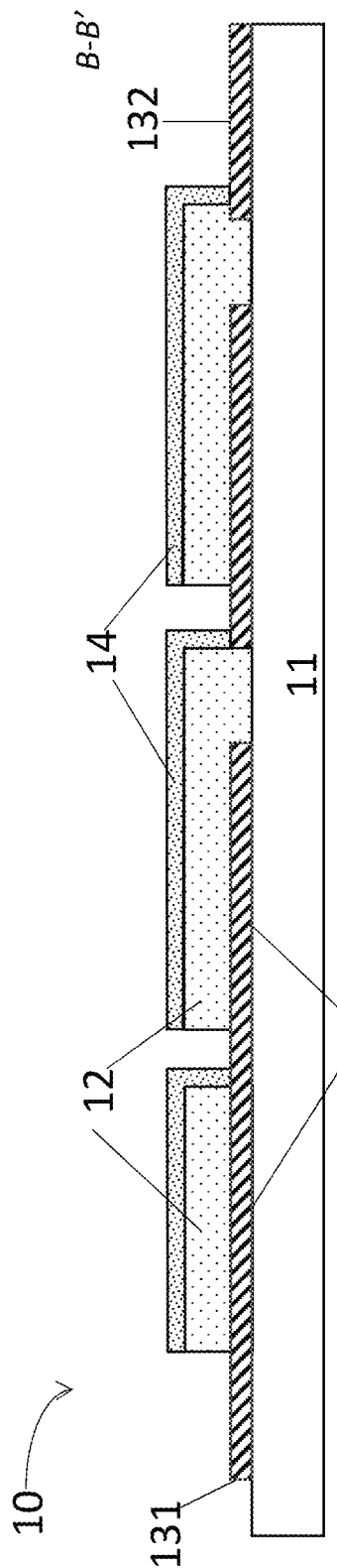
FIG. 6
FIG. 7

PARTIALLY TRANSLUCENT PHOTOVOLTAIC MODULES AND METHODS FOR MANUFACTURING

CROSS-REFERENCE TO RELATED APPLICATION

The present application is a national stage entry of PCT/EP2018/052838 filed Feb. 5, 2018, which claims priority to EP 17154742.5 filed on Feb. 6, 2017, the contents of each of which are hereby incorporated by reference.

FIELD OF THE DISCLOSURE

The present disclosure relates to methods for fabricating photovoltaic modules of a predetermined size and shape, and more in particular to methods for fabricating partially translucent, e.g. partially transparent, thin-film photovoltaic modules of a predetermined size and shape.

The present disclosure further relates to photovoltaic modules, more in particular to partially translucent, e.g. partially transparent, thin-film photovoltaic modules of a predetermined size and shape.

STATE OF THE ART

Partially transparent thin-film photovoltaic modules are known. They are only available in relatively small sizes, such as for example with a width of 150 cm and a length of 60 cm. Size limitations of thin-film photovoltaic modules may for example be related to size limitations of the equipment used for fabricating thin-film photovoltaic modules. However, for building integrated photovoltaic applications, wherein for example window elements or facade elements having typical dimensions in the range between 2 to 4 m by 1 to 2 m are used, the available sizes may not be suitable. For building integrated photovoltaic applications there is also a need to provide different photovoltaic module sizes, for example any photovoltaic module size, e.g. non-standard size, for example to comply with architects' requirements.

SUMMARY

Some embodiments of the present disclosure provide methods for fabricating thin-film photovoltaic modules of a predetermined size that may be relatively large, e.g. having dimensions up to 4 m by 2 m, wherein the photovoltaic modules may be non-translucent or partially translucent, e.g. partially transparent, the present disclosure not being limited thereto. More in particular, some embodiments of the present disclosure provide methods for forming electrical interconnections between photovoltaic plates within such thin-film photovoltaic modules.

Some embodiments of the present disclosure provide thin-film photovoltaic modules of a predetermined size that may be relatively large, e.g. having dimensions up to 4 m by 2 m, wherein the photovoltaic modules may be non-translucent or partially translucent, e.g. partially transparent, the present disclosure not being limited thereto.

In embodiments of the present disclosure, the thin-film photovoltaic modules may for example comprise photovoltaic cells based on chalcogenide materials such as e.g. CdTe (Cadmium Telluride), CIS (Copper Indium Selenide), CGS (Copper Gallium Selenide), CIGS (Copper Indium Gallium Selenide, Copper Indium Gallium Sulfide), e.g. kesterites such as CZTS (Copper Zinc Tin Sulfide, Copper Zinc Tin Selenide), amorphous silicon, microcrystalline silicon, polycrystalline silicon, organic materials or perovskite materials, the present disclosure not being limited thereto. Furthermore, methods described herein may also be applied to other than thin-film photovoltaic modules, e.g. wafer based photovoltaic modules, such as for example polycrystalline or monocrystalline silicon photovoltaic modules.

The above objectives are accomplished by methods and devices according to embodiments of the present disclosure.

In a first aspect the present disclosure is related to a method for electrically interconnecting a plurality of thin-film photovoltaic plates, wherein the method comprises: positioning a plurality of thin-film photovoltaic plates next to each other side by side, each of the plurality of thin-film photovoltaic plates being partially translucent or non-translucent and comprising at least one first plate electrode of a first polarity and at least one second plate electrode of a second polarity opposite to the first polarity, the at least one first plate electrode and the at least one second plate electrode being at least partially exposed on the same surface and at opposite edges of the thin-film photovoltaic plate; providing at least one connection element on a surface of each of the plurality of thin-film photovoltaic plates, the at least one connection element comprising a plurality of electrically conductive wires arranged in a grid structure; physically separating each connection element into a first connection part comprising a plurality of first electrically interconnected conductive wires and a second connection part comprising a plurality of second electrically interconnected conductive wires such that, on a surface of each of the plurality of thin-film photovoltaic plates, the plurality of first electrically interconnected conductive wires are electrically insulated from the plurality of second electrically interconnected conductive wires; forming, for each of the plurality of thin-film photovoltaic plates, a first electrical connection between corresponding first electrically interconnected conductive wires and the at least one first plate electrode; forming, for each of the plurality of thin-film photovoltaic plates, a second electrical connection between corresponding second electrically interconnected conductive wires and the at least one second plate electrode; providing a first busbar of the first polarity and a second busbar of the second polarity; and forming, for each of the plurality of thin-film photovoltaic plates, a first electrical busbar connection between the corresponding first electrically interconnected conductive wires and the first busbar and a second electrical busbar connection between the corresponding second electrically interconnected conductive wires and the second busbar, thereby electrically interconnecting the plurality of thin-film photovoltaic plates.

In embodiments of the present disclosure, for at least one, for instance for each, of the plurality of thin-film photovoltaic plates, the surface on which the at least one connection element is provided may be a front surface of the photovoltaic plates. However, the present disclosure is not limited thereto. In other embodiments of the present disclosure, for each of the plurality of thin-film photovoltaic plates, the surface on which the connection element is provided may be the back surface of the photovoltaic plates. In still other embodiments of the present disclosure, for part of the plurality of thin-film photovoltaic plates, e.g. for at least one of the plurality of thin-film photovoltaic plates, the surface on which the connection element is provided may be the front surface and for the remaining part of the plurality of thin-film photovoltaic plates the surface on which the connection element is provided may be the back surface of the photovoltaic plates.

In embodiments of the present disclosure, each of the plurality of thin-film photovoltaic plates may comprise a plurality of thin-film photovoltaic cells, each cell comprising a first cell electrode and a second cell electrode. The method in accordance with embodiments of the present disclosure may further comprise providing an optically transparent electrically insulating layer on the surface of the plurality of thin-film photovoltaic plates on which the at least one connection element is provided, to thereby electrically insulate the first cell electrodes and the second cell electrodes from the at least one connection element.

In embodiments of the present disclosure, the optically transparent electrically insulating layer may be provided before providing the at least one connection element. In embodiments of the present disclosure, the optically transparent electrically insulating layer and the at least one connection element may be provided simultaneously. For example, the at least one connection element may be integrated with, e.g. attached to, the optically transparent electrically insulating layer before they are provided on the surface of a photovoltaic plate.

In a method according to embodiments of the present disclosure, forming the first electrical connection and forming the second electrical connection may for example comprise welding, soldering, gluing, pressing, printing of an electrically conductive structure, welding of an electrically conductive structure or soldering of an electrically conductive structure or any combination thereof.

In a method according to embodiments of the present disclosure, forming the first busbar connection and forming the second busbar connection may comprise welding, soldering, gluing, pressing, printing of an electrically conductive structure, welding of an electrically conductive structure or soldering of an electrically conductive structure or any combination thereof.

In embodiments of the present disclosure, forming the first busbar connections and forming the second busbar connections results in the plurality of photovoltaic plates being electrically interconnected with each other. In particular embodiments of the present disclosure the plurality of photovoltaic plates within a photovoltaic module is electrically interconnected in parallel. However, the present disclosure is not limited thereto. In other embodiments, the plurality of photovoltaic plates may be electrically interconnected in series, or a combination of parallel and series interconnections may be used.

In embodiments of the present disclosure, the at least one connection element may for example have an optical transparency of more than 90%, more than 95%, or more than 98%, the present disclosure not being limited thereto.

In embodiments of the present disclosure, the connection element may for example have a sheet resistance lower than 10 Ohm per square, lower than 2 Ohm per square, lower than 0.5 Ohm per square, or lower than 0.1 Ohm per square, the present disclosure not being limited thereto.

In a second aspect the present disclosure is related to a method for manufacturing a thin-film photovoltaic module, wherein the method comprises: providing a plurality of thin-film photovoltaic plates being partially translucent or non-translucent and comprising at least one first plate electrode of a first polarity and at least one second plate electrode of a second polarity opposite to the first polarity, the at least one first plate electrode and the at least one second plate electrode being at least partially exposed on the same surface and at opposite edges of the thin-film photovoltaic plate; providing a first encapsulation sheet; electrically interconnecting the plurality of thin-film photovoltaic plates by a method according to an embodiment of the first aspect, wherein providing the first busbar of the first polarity and the second busbar of the second polarity comprises providing the first busbar and the second busbar on the first encapsulation sheet and wherein positioning the plurality of thin-film photovoltaic plates next to each other side by side comprises positioning the plurality of thin-film photovoltaic plates on the first encapsulation sheet having the first busbar and the second busbar provided thereon, thereby leaving the first busbar and the second busbar at least partially exposed. The first encapsulation sheet may correspond to a front encapsulation sheet (front plate, cover sheet, cover plate) or to a back encapsulation sheet (back plate, carrier sheet, carrier plate) of the photovoltaic module. A method according to the second aspect of the present disclosure further comprises providing a second encapsulation sheet on the plurality of thin-film photovoltaic plates (at a side of the thin-film photovoltaic plates opposite to the side of the first encapsulation sheet) and performing a lamination step to thereby encapsulate the plurality of thin-film photovoltaic plates in between the first encapsulation sheet and the second encapsulation sheet and to thereby form a thin-film photovoltaic module. In embodiments wherein the first encapsulation sheet corresponds to a front side encapsulation sheet, the second encapsulation sheet corresponds to a back or rear encapsulation sheet of the photovoltaic module, and vice versa, in embodiments wherein the first plate corresponds to a back encapsulation sheet, the second plate corresponds to a front encapsulation sheet.

A method according to the second aspect of the present disclosure may further comprise providing an encapsulation layer, the encapsulation layer being provided in between the plurality of thin-film photovoltaic plates and at least one of the first encapsulation sheet and the second encapsulation sheet. In embodiments of the present disclosure, the at least one connection element may be provided separately or it may for example be integrated with the encapsulation layer. In embodiments of the present disclosure, the optically transparent electrically insulating layer, the at least one connection element and the encapsulation layer may be integrated into a single sheet, for instance before they are provided on a surface of the plurality of thin-film photovoltaic plates. In embodiments of the present disclosure the connection element may be integrated with, e.g. provided on a surface of, the second encapsulation sheet.

In particular embodiments of the present disclosure the plurality of photovoltaic plates within a photovoltaic module is electrically interconnected in parallel. However, the present disclosure is not limited thereto. In other embodiments, the plurality of photovoltaic plates may be electrically interconnected in series, or a combination of parallel and series interconnections may be used.

In embodiments of a method according to the second aspect of the present disclosure, placing the plurality of thin-film photovoltaic plates next to each other side by side may comprise positioning the plurality of plates such that plate electrodes of adjacent thin-film photovoltaic plates having a same polarity are located next to and facing each other. For example, the plurality of thin-film photovoltaic plates may be positioned such that the first plate electrode of a thin-film photovoltaic plate is positioned next to the first plate electrode of a neighboring thin-film photovoltaic plate. For example, the plurality of thin-film photovoltaic plates may be positioned such that the second plate electrode of a thin-film photovoltaic plate is positioned next to the second plate electrode of a neighboring photovoltaic plate. In some embodiments, a relatively straightforward parallel electrical interconnection may be established between the photovoltaic plates. However, the present disclosure is not limited thereto and other relative photovoltaic plate positions or orientations may be used.

In embodiments of the present disclosure, positioning the plurality of thin-film photovoltaic plates may comprise arranging the plurality of thin-film photovoltaic plates in a linear array. In embodiments of the present disclosure, positioning the plurality of thin-film photovoltaic plates may comprise arranging the plurality of thin-film photovoltaic plates in a two-dimensional array.

In a third aspect, the present disclosure is related to a thin-film photovoltaic module comprising: a plurality of thin-film photovoltaic plates positioned next to each other side by side, each of the thin-film photovoltaic plates being partially translucent or non-translucent and comprising at least one first plate electrode of a first polarity and at least one second plate electrode of a second polarity opposite to the first polarity, the at least one first plate electrode and the at least one second plate electrode being at least partially exposed on the same surface and at opposite edges of the thin-film photovoltaic plate; for each of the plurality of thin-film photovoltaic plates, a connection element provided on a surface thereof, the connection element comprising a plurality of electrically conductive wires arranged in a grid structure and physically separated into a first connection part comprising a plurality of first electrically interconnected conductive wires and a second connection part comprising a plurality of second electrically interconnected conductive wires, the plurality of first electrically interconnected conductive wires being electrically insulated from the plurality of second electrically interconnected conductive wires; for each of the plurality of thin-film photovoltaic plates, a first electrical connection between corresponding first electrically interconnected conductive wires and the at least one first plate electrode and a second electrical connection between corresponding second electrically interconnected conductive wires and the at least one second plate electrode; a first busbar of the first polarity and a second busbar of the second polarity; and for each of the plurality of thin-film photovoltaic plates, a first electrical busbar connection between the corresponding first electrically interconnected conductive wires and the first busbar and a second electrical busbar connection between the corresponding second electrically interconnected conductive wires and the second busbar.

In some embodiments, electrical connections and electrical interconnections may be invisible or nearly invisible to the naked eye, which may be considered as an esthetical asset. Some example methods and devices may result in a substantially uniform appearance of the modules, which may be considered as an additional esthetical asset.

In some embodiments, relatively large thin-film photovoltaic modules of any size may be provided, such as for example a size up to 4 m by 2 m, the present disclosure not being limited thereto.

In some embodiments, such relatively large thin-film photovoltaic modules may be partially translucent, e.g. partially transparent, the present disclosure not being limited thereto.

In some embodiments, thin-film photovoltaic modules of different sizes, e.g. non-standard sizes, may be provided wherein the modules have a same output, such as for example a same output voltage, independent of their size.

Some embodiments allow fabricating thin-film photovoltaic modules of any predetermined size having a predetermined output voltage. For example, in embodiments of the present disclosure a plurality of thin-film photovoltaic plates having a same output voltage may be electrically interconnected in parallel to form a module of any desired size, such that an output voltage of the module is independent on the number of interconnected thin-film photovoltaic plates and thus independent on the module size.

In some embodiments, a same or similar electrical interconnection technology may be used for non-translucent and partially translucent, e.g. partially transparent, photovoltaic modules. Furthermore, a same or a similar electrical interconnection technology may be used for thin-film photovoltaic modules and for wafer based photovoltaic modules.

In some embodiments, photovoltaic plates having a standard, commercially available, size may be used for forming photovoltaic modules of any desired size. In some embodiments, this allows using the available mass production equipment for fabricating the plates, leading to cost-effectiveness.

In some embodiments, manufacturing may be done in a semi-automated or automated way. In some embodiments, labor-intensive and thus expensive manual assembly may be avoided, thus leading to an industrially viable, relatively low-cost manufacturing technology.

In some embodiments, the module encapsulation may done simultaneously with the formation of electrical connections to the plurality of photovoltaic plates, the formation of electrical interconnections between the plurality of photovoltaic plates, and/or with the step of providing an insulating material between the plurality of photovoltaic plates and the connection element. Therefore, the number of manufacturing steps may be reduced, which may result in a reduction of manufacturing costs.

In embodiments where the connection element is integrated with or attached to a carrier, such as for example an encapsulation layer or for example an encapsulation sheet, processing and handling of the connection element may be made easier and/or dimensional stability and structural integrity may be improved.

Photovoltaic modules according to embodiments of the third aspect of the present disclosure may be used for building integrated applications.

In some embodiments, the presence within the module of connection elements comprising a plurality of electrically conductive wires may mechanically reinforce the photovoltaic modules, e.g. in a similar way as in wire reinforced glass.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 6 schematically show examples of a cross section of a photovoltaic plate having a first plate electrode and a second plate electrode, according to example embodiments.

FIG. 7 schematically show examples of a cross section of a photovoltaic plate having a first plate electrode and a second plate electrode, according to example embodiments.

Figure 1:
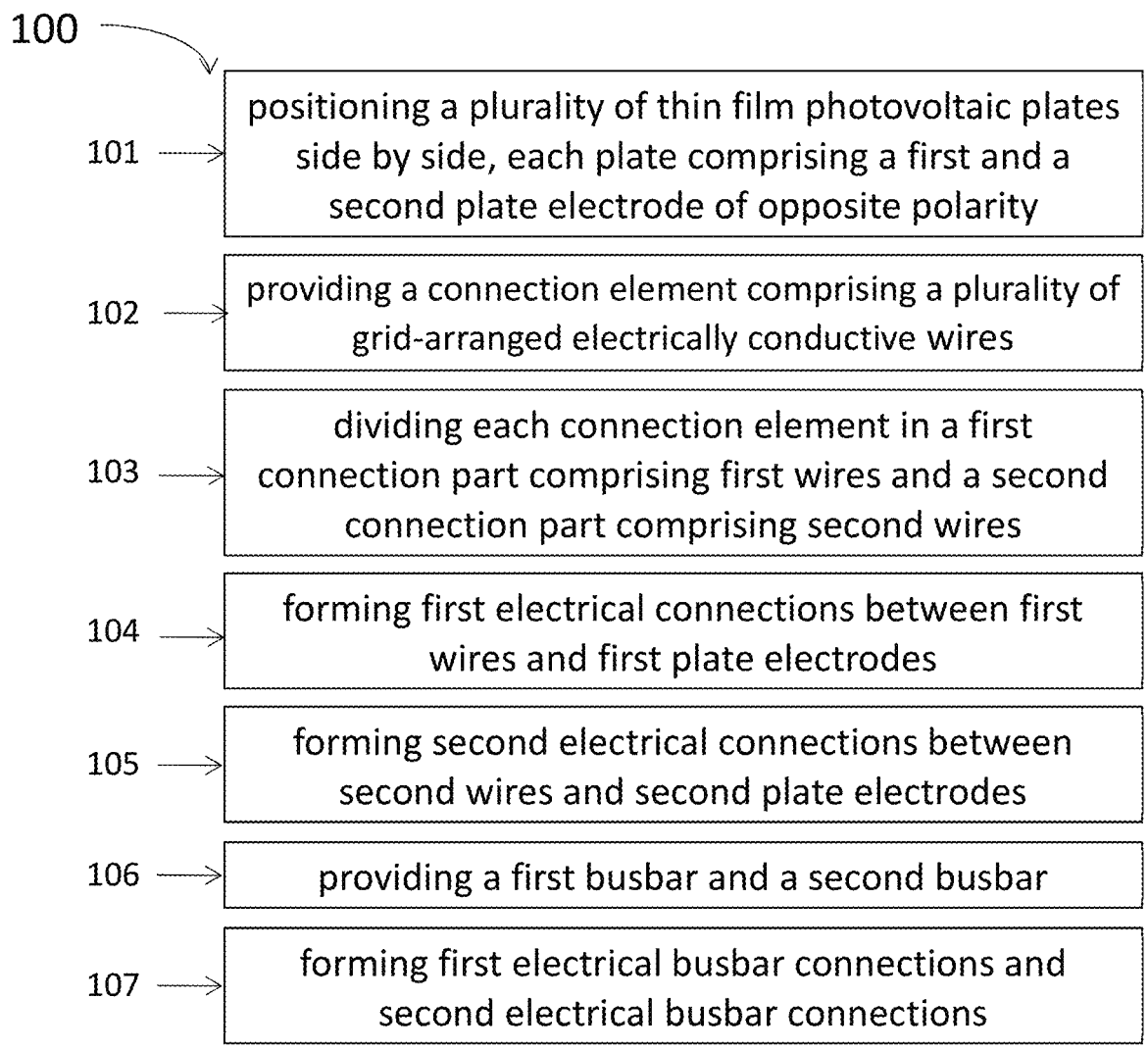
FIG. 1 illustrates an example of process steps of a method for electrically interconnecting a plurality of thin-film photovoltaic plates, according to example embodiments.

In the different figures, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claim requires more features than are expressly recited in each claim. Rather, as the following claims reflect, certain disclosed aspects may lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, understood methods, structures and techniques have not been shown in detail in order not to obscure an understanding of this description.

Although in the description provided herein the focus is on thin: film photovoltaic modules, the present disclosure is not limited thereto and the same or similar methods may also be used for other types of photovoltaic modules, such as for example wafer based photovoltaic modules, e.g. crystalline silicon photovoltaic modules.

The following terms are provided solely to aid in the understanding of the disclosure.

In the context of the present disclosure, a thin-film is a thin layer or thin coating having a thickness in the range between 10 nm and 10 micrometers. A thin-film photovoltaic cell is a photovoltaic cell wherein the different layers forming the cell are thin layers, typically made by deposition of a stack of thin layers on a substrate such as a glass substrate, a plastic substrate or a metal substrate, the present disclosure not being limited thereto. This definition of a thin-film photovoltaic cell does not exclude the presence of even thinner layers within the thin-film photovoltaic cell structure, such as for example thin passivation layers or tunnel layers, e.g. having a thickness that may be less than 10 nm.

In the context of the present disclosure, a thin-film photovoltaic stack is a stack comprising thin layers forming a thin-film photovoltaic cell, wherein the stack comprises at least an active layer or active layer stack for light absorption and charge carrier separation, a first contact layer of a first polarity and a second contact layer of a second polarity opposite to the first polarity. The active layer stack may for example comprise an n-type semiconductor layer and a p-type semiconductor layer. However, additional layers may be included, such as for example an intrinsic semiconductor layer, a hole transporting layer, a hole blocking layer, an electron transporting layer and/or an electron blocking layer, the present disclosure not being limited thereto.

In the context of the present disclosure, a thin-film photovoltaic plate is a structure comprising a substrate, such as for example a glass substrate, a plastic substrate or a metal substrate, with a thin-film photovoltaic stack deposited thereon. The thin-film photovoltaic stack may be patterned to form a plurality of photovoltaic cells monolithically integrated on the substrate and electrically interconnected for example in series, the present disclosure not being limited thereto. A photovoltaic plate does not contain external electrical connections. It is not encapsulated, such that the photovoltaic stack is exposed at a side opposite to the substrate side, i.e. not covered by another layer such as an encapsulation layer or an encapsulation sheet (encapsulation plate).

In the context of the present disclosure, a photovoltaic module is a photovoltaic device comprising a plurality of electrically interconnected photovoltaic cells embedded between a back encapsulation sheet, e.g. rear carrier or rear substrate, and a front encapsulation sheet, e.g. front carrier, front cover or superstrate, and further comprising a module frame and external electrical connections, for example for further electrical connection to another photovoltaic module or to a load. A photovoltaic module may further comprise additional elements, such as for example a junction box, a maximum power point tracker and appropriate wiring and electrical connections. These additional elements may for example be integrated within the module frame. The plurality of electrically interconnected photovoltaic cells may be monolithically integrated on one or more substrates (such as for example in case of thin-film photovoltaic cells/modules) or they may be provided each with their own substrate (such as for example in case of wafer based cells/modules).

In the context of the present disclosure, the front surface or front side of a photovoltaic cell, of a photovoltaic plate or of a photovoltaic module is the surface or side adapted for being oriented towards a light source and thus for receiving illumination. In case of bifacial photovoltaic cells, plates or modules, both surfaces are adapted to receive impinging light. In such case, the front surface or front side is the surface or side adapted for receiving the largest fraction of the light or illumination. The back surface, rear surface, back side or rear side of a photovoltaic cell, a photovoltaic plate or a photovoltaic module is the surface or side opposite to the front surface or side.

In the context of the present disclosure, reference is made to connection elements comprising a plurality of electrically conductive wires. In the context of the present disclosure, the term "wires" also includes ribbons, such as for example threads, rods, lines or strips, the present disclosure not being limited thereto. Wires or ribbons as used herein may for example be provided in the form of a fabric, e.g. a woven fabric, or they may for example be printed or plated on a substrate, such as on a foil, e.g. an insulating foil, the present disclosure not being limited thereto. In the context of the present disclosure, "wires" may for example also refer to elements of expanded metal mesh structures, the present disclosure not being limited thereto.

The present disclosure is related to non-translucent, partially translucent and partially transparent photovoltaic plates and photovoltaic modules.

Translucency includes transparency, i.e. transparency is a subset of translucency. Transparency refers to the physical property of allowing light to pass through without being scattered. Translucency refers to the physical property of allowing light to pass through, wherein the photons may be scattered or not. In the further description, when "translucent" or "translucency" is used it is understood that this also includes "transparent" or "transparency", respectively.

The disclosure will now be described by a detailed description of several embodiments. It is clear that other embodiments can be configured according to the knowledge of persons skilled in the art without departing from the technical teaching of the disclosure, the disclosure being limited only by the terms of the appended claims.

In a first aspect, the present disclosure relates to methods for electrically interconnecting a plurality of thin-film photovoltaic plates positioned next to each other side by side, each of the thin-film photovoltaic plates comprising a first plate electrode of a first polarity and a second plate electrode of a second polarity opposite to the first polarity.

An example of process steps of a method according to an embodiment of the first aspect of the present disclosure is schematically illustrated in FIG. 1.

The method 100 illustrated in FIG. 1 comprises positioning (FIG. 1, step 101) a plurality of thin-film photovoltaic plates next to each other side by side. In embodiments of the present disclosure each of the thin-film photovoltaic plates comprises a first plate electrode of a first polarity and a second plate electrode of a second polarity opposite to the first polarity. The first plate electrode and the second plate electrode are exposed at least partially, i.e. the first plate electrode and the second plate electrode are not fully covered by another layer. This allows providing an electrical connection to the first plate electrode and the second plate electrode in a further process step of a method 100.

In some embodiments of a method 100 in accordance with the present disclosure, the plurality of thin-film photovoltaic plates may be positioned next to each other such that for neighboring photovoltaic plates the electrodes of a same polarity are located next to each other. In other words, the plurality of thin-film photovoltaic plates may be placed next to each other with their first plate electrode next to the first plate electrode of a neighboring photovoltaic plate and/or with their second plate electrode next to the second plate electrode of a neighboring photovoltaic plate, thus facilitating a relatively straightforward parallel electrical interconnection of the thin-film photovoltaic plates in a later process step.

Figure 3:
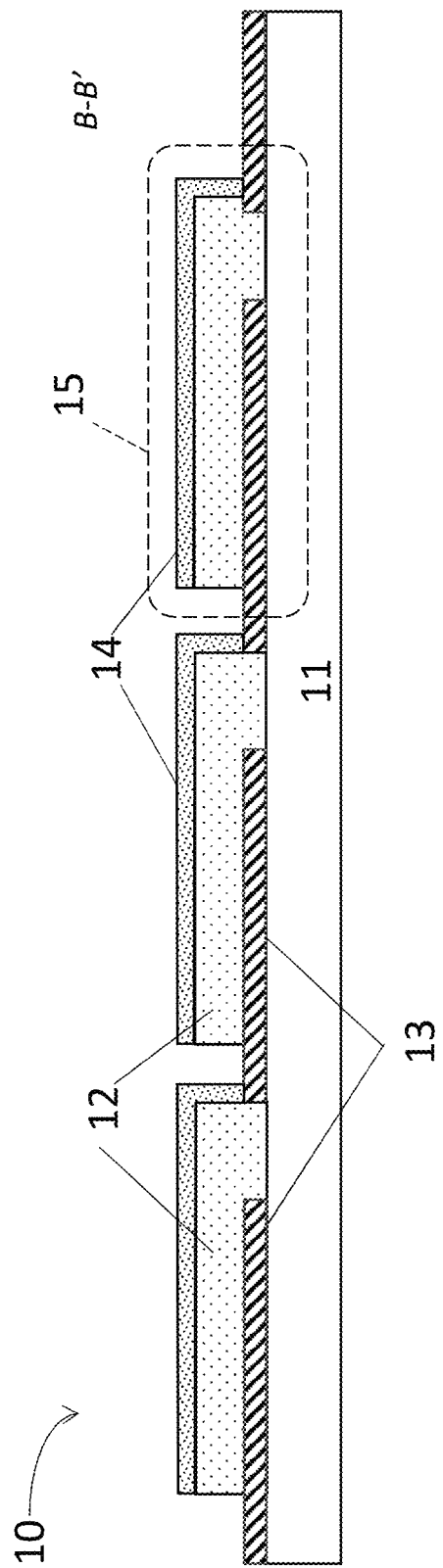
FIG. 3 schematically illustrates an example of a cross section of a thin-film photovoltaic plate, according to example embodiments.

FIG. 3 schematically illustrates an example of a cross section of a (part of) a thin-film photovoltaic plate 10, as may for example be used in embodiments of the present disclosure. The thin-film photovoltaic plate shown in FIG. 3 comprises a substrate 11 on which a plurality of patterned layers is provided, more in particular a first patterned layer forming a plurality of first cell electrodes 13, a second patterned layer forming a plurality of cell active layers 12 and a third patterned layer forming a plurality of second cell electrodes 14, the plurality of second cell electrodes 14 having a polarity opposite to a polarity of the plurality of first cell electrodes 13. Each stack comprising a first cell electrode 13, a cell active layer 12 and a second cell electrode 14 forms a thin-film photovoltaic cell 15.

The substrate 11 may for example be a glass substrate, a plastic substrate such as a plastic foil, a semiconductor substrate, a composite substrate or a metal foil such as a steel foil, the present disclosure not being limited thereto. In embodiments wherein the photovoltaic plates are used for fabricating partially translucent, e.g. partially transparent, photovoltaic modules, the substrate is a translucent, e.g. transparent, substrate such as a glass substrate or a translucent, e.g. transparent, plastic substrate.

In the example shown in FIG. 3, the patterned layers 12, 13, 14 form a plurality of thin-film photovoltaic cells 15 that are electrically interconnected in series. The plurality of first cell electrodes 13 is provided on the substrate 11 and may comprise any suitable electrically conductive material, for example a metal, such as copper, gold, silver, molybdenum or platinum, a metal alloy, an electrically conductive oxide or an electrically conductive polymer. The active layer 12 is patterned to form the plurality of photovoltaic cells 15. It may comprise more than one thin-film layer, for example a plurality of stacked layers, i.e. the active layer 12 may be a stack comprising a plurality of thin-film layers. It comprises at least a first thin-film semiconductor layer having the function of an absorber layer wherein light can be absorbed and wherein electrons and holes can be generated upon light absorption. The absorber layer may for example be a layer comprising a chalcogenide semiconductor material such as e.g. CdTe (Cadmium Telluride), CIS (Copper Indium Selenide), CGS (Copper Gallium Selenide), CIGS (Copper Indium Gallium Selenide, Copper Indium Gallium Sulfide), e.g. a kesterite such as CZTS (Copper Zinc Tin Sulfide, Copper Zinc Tin Selenide), or a layer comprising amorphous silicon, crystalline silicon, an organic material or a perovskite material, the present disclosure not being limited thereto. The active layer 12 may further comprise a second thin-film semiconductor layer forming a homo-junction or a hetero-junction with the first thin-film semiconductor layer, enabling separation of light-generated charge carriers. The active layer may comprise a single junction or it may comprise more than one junction (tandem cell). The active layer 12 may further comprise a charge transport layer (a hole transport layer and/or an electron transport layer), for example for facilitating charge transport towards the first cell electrode 13 and/or towards the second cell electrode 14. The active layer 12 may further comprise a charge injection layer (a hole injection layer and/or an electron injection layer), for example for reducing a contact resistance between the active layer 12 and the first cell electrode 13 and/or for reducing a contact resistance between the active layer 12 and the second cell electrode 14. The plurality of second cell electrodes 14 may comprise any suitable electrically conductive material, for example a metal, such as copper, gold, silver, molybdenum or platinum, a metal alloy, an electrically conductive oxide or an electrically conductive polymer. In embodiments of the present disclosure at least one of the plurality of first cell electrodes 13 and the plurality of second cell electrodes 14 is made of a substantially transparent electrically conductive material, such as for example a TCO (Transparent Conductive Oxide), such as for example Indium Tin Oxide or Zinc Oxide, or graphene, the present disclosure not being limited thereto. More in particular, at least the plurality of cell electrodes located closest to a front side (i.e. light receiving side) of the photovoltaic plates, is made of a substantially transparent electrically conductive material. The front side of a photovoltaic plate 10 may correspond to the substrate side or it may correspond to the side opposite to the substrate side. In the example shown in FIG. 3 each second cell electrode 14 is electrically connected to the first cell electrode 13 of a neighboring photovoltaic cell, such that all photovoltaic cells 15 provided on the substrate 11 are electrically interconnected in series. However, the present disclosure is not limited thereto.

Figure 4A:
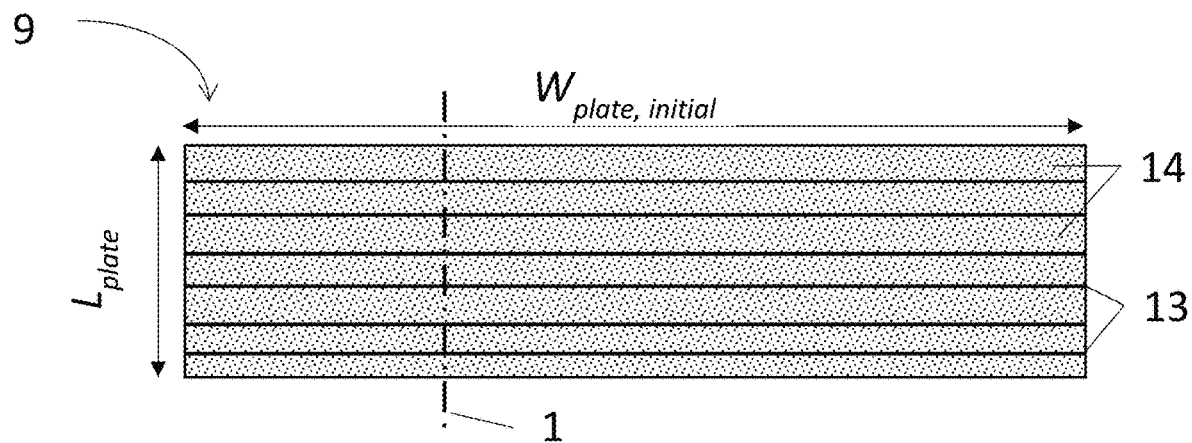
FIG. 4A schematically illustrates an example (top view) of cutting an initial photovoltaic plate to thereby obtain photovoltaic plates of smaller size, according to example embodiments.

In a method according to embodiments of the present disclosure, an initial, as-fabricated thin-film photovoltaic plate 9 may be cut into two or more smaller photovoltaic plates 10, so as to obtain photovoltaic plates of a predetermined, smaller size. This is schematically illustrated in FIG. 4A, showing a top view of an initial photovoltaic plate 9 having a length $L_{plate}$ and an initial width $W_{plate,\ initial}$. However, the present disclosure is not limited thereto, and in embodiments of the present disclosure initial, as-fabricated thin-film photovoltaic plates 9 may be used instead of cutting them into smaller photovoltaic plates 10.

In the example shown in FIG. 4A the active layer 12 is patterned to form rectangular shaped photovoltaic cells 15 having a cell width corresponding to the initial plate width $W_{plate,\ initial}$. The first cell electrodes 13 and the second cell electrodes 14 are patterned accordingly. FIG. 4A schematically shows a cutting line 1, as an example of a line along which the initial photovoltaic plate 9 may be cut to obtain two photovoltaic plates 10 of smaller size. In the example shown, the cutting line 1 is oriented substantially orthogonal to a longitudinal direction (width direction) of the rectangular shaped photovoltaic cells. However, the present disclosure is not limited thereto.

Figure 4B:
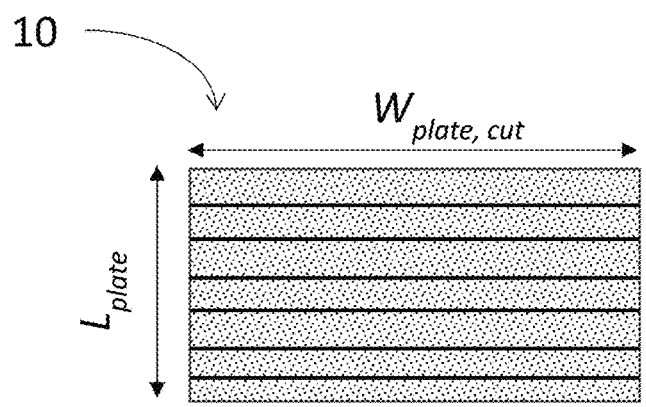
FIG. 4B schematically shows a top view of an example of a photovoltaic plate of smaller size, according to example embodiments.

FIG. 4B schematically shows a top view of a cut photovoltaic plate 10, in the example shown having the same length $L_{plate}$ as the initial photovoltaic plate and having a smaller width $W_{plate,cut}$. In methods according to embodiments of the present disclosure, the smaller, cut photovoltaic plates 10 may be used for forming thin-film photovoltaic modules of a predetermined size and shape. However, the present disclosure is not limited thereto, and in embodiments of the present disclosure also initial, as-fabricated thin-film photovoltaic plates 9 may be used instead of smaller photovoltaic plates 10 for forming thin-film photovoltaic modules of a predetermined size and shape. Typical initial dimensions of commercially fabricated thin-film photovoltaic plates 9, such as for example CIGS photovoltaic plates, may for example be in the order of 150 cm (length $L_{plate}$) by 60 cm (width $W_{plate,initial}$), but thin-film photovoltaic plates with other initial dimensions may be commercially available.

Figure 5A:
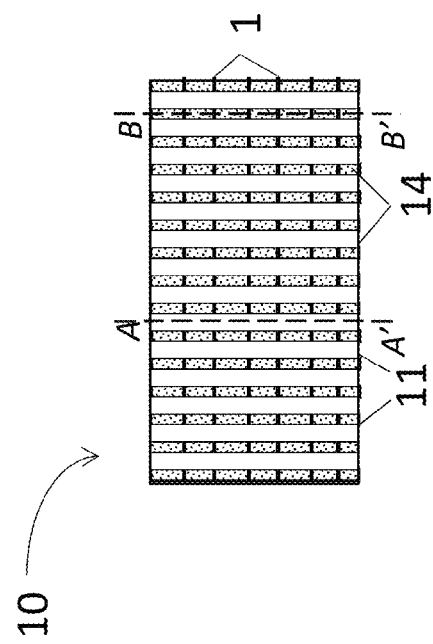
FIG. 5A schematically shows a top view of an example of a photovoltaic plate of smaller size wherein the photovoltaic plate is partially translucent, e.g. partially transparent, according to example embodiments.
Figure 5B:
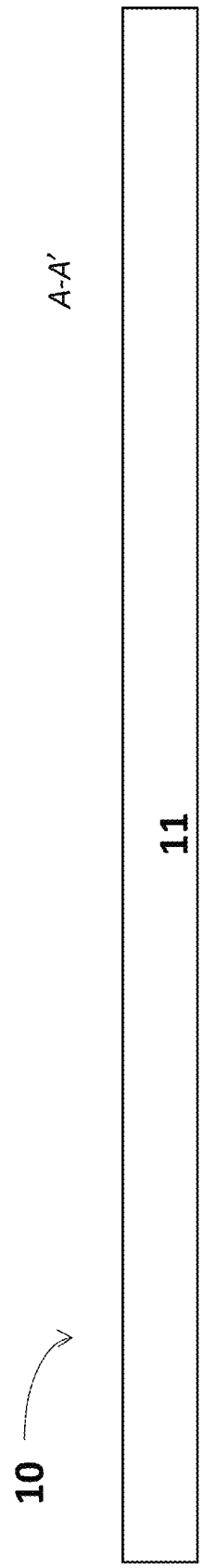
FIG. 5B schematically shows a cross section along line A-A' of an example of a partially translucent, e.g. partially transparent, photovoltaic plate, according to example embodiments.

In embodiments of the present disclosure the photovoltaic plate 9, 10 may be made partially translucent, e.g. partially transparent, for example by removing the first cell electrode 13, the active layer 12 and the second cell electrode 14 of a plurality of photovoltaic cells at predetermined locations. FIG. 5A schematically shows a top view of a partially translucent, e.g. partially transparent, photovoltaic plate 10 wherein for each of the photovoltaic cells the first cell electrode 13, the active layer 12 and the second cell electrode 14 have been removed in a part of each photovoltaic cell 15. In the example shown these layers have been locally removed according to a pattern comprising rectangular shaped areas that are oriented with a longitudinal direction substantially orthogonal to a longitudinal direction of the photovoltaic cells. This is however only an example, and local removal of the first cell electrodes 13, the active layers 12 and the second cell electrodes 14 can be done according to any other, regular or irregular, pattern. FIG. 5B schematically shows a cross section of a partially translucent, e.g. partially transparent, photovoltaic plate 10, according to line A-A' shown in FIG. 5A. The first cell electrode 13, the active layer 12 and the second cell electrode 14 have been locally removed, such that locally the photovoltaic plate 10 only comprises the substrate 11, e.g. translucent substrate 11, e.g. transparent substrate 11. Locally removing the first cell electrode 13, the active layer 12 and the second cell electrode 14 may for example be done by laser ablation or by mechanical scribing, the present disclosure not being limited thereto. In embodiments of the present disclosure wherein the photovoltaic plates are made partially translucent, e.g. partially transparent, at least 10% or at least 20%, of the photovoltaic plate 10 may be translucent, e.g. transparent. For example, in embodiments of the present disclosure 10% to 70%, for example 20% to 60% of the photovoltaic plate 10 may be translucent, e.g. transparent, the present disclosure not being limited thereto. However, as mentioned before, the present disclosure is not limited to partially translucent, e.g. partially transparent, photovoltaic plates, and also non-translucent photovoltaic plates may be used. A cross section of a photovoltaic plate along line B-B' shown in FIG. 5A may for example correspond to the cross section shown in FIG. 6 or FIG. 7, the present disclosure not being limited thereto.

In embodiments of the present disclosure wherein the first cell electrodes 13 are optically translucent or transparent, there may be no need to locally remove the first cell electrode 13 when making a photovoltaic plate partially translucent, e.g. partially transparent. In such embodiments only the second cell electrode 14 and the active layer 12 may be locally removed, such that locally (e.g. in a cross section as in FIG. 5A the photovoltaic plate only comprises a stack of a translucent, e.g. transparent, substrate and a translucent, e.g. transparent, first electrode.

FIG. 6 and FIG. 7 schematically show examples of a cross section of a photovoltaic plate 10 having a first plate electrode 131 and a second plate electrode 132. In the examples shown, the first plate electrode 131 corresponds to the first electrode 13 of a photovoltaic cell located at a first edge of the photovoltaic plate and the second plate electrode 132 corresponds to the first electrode 13 of a photovoltaic cell located at a second, opposite edge of the photovoltaic plates 10. In methods according to embodiments of the present disclosure, the first plate electrode 131 and the second plate electrode 132 are used for making electrical connections to a photovoltaic plate 10 and for electrically interconnecting photovoltaic plates 10 with each other. First electrodes 13 and second electrodes 14 are used for electrically interconnecting photovoltaic cells that are monolithically integrated on the substrate 11, i.e. for electrically interconnecting photovoltaic cells 15 within a photovoltaic plate 10. Such electrodes for electrically interconnecting photovoltaic cells are further also referred to as cell electrodes (first cell electrodes 13 and second cell electrodes 14). The first plate electrode 131 and the second plate electrode 132 correspond to first electrodes 13 located at opposite outer edges of the photovoltaic plate 10 and are used for providing electrical interconnections between a photovoltaic plate 10 and another element, such as for example another photovoltaic plate 10.

In the cross section illustrated in FIG. 6 all photovoltaic cells are electrically interconnected in series. The first electrode 13 located at a first edge of the photovoltaic plate (first plate electrode 131) and the first electrode 13 located at a second, opposite edge of the photovoltaic plate (second plate electrode 132) laterally extend beyond the active layers 12 of the photovoltaic cells. These first electrodes 13 (first plate electrode 131 and second plate electrode 132) can therefore be contacted electrically, to thereby form a first electrical connection and a second electrical connection.

In some embodiments, the first electrodes 13 at the first edge and/or at the second edge of the photovoltaic plate may be insufficiently exposed to enable making a first electrical connection and/or second electrical connection. In such cases, removing material layers (active layer 12, second electrode 14) covering the first electrode 13 may be useful to thereby expose at least partially the first plate electrode 131 and/or the second plate electrode 132 to enable electrical connection. In order to avoid current mismatching between the photovoltaic cells, more in particular between the photovoltaic cells at the edges and the other (series interconnected) cells of the photovoltaic plate 10, the photovoltaic cell located at a first edge of the photovoltaic plate may be made inactive, as for example schematically illustrated in FIG. 7. In this embodiment, the first electrode 13 of the photovoltaic cell located at the first edge of the photovoltaic plate (first plate electrode 131) extends to the first electrode 13 of the neighboring photovoltaic cell, without an interruption therein between, i.e. the first electrode 13 of the photovoltaic cell located at the first edge is electrically connected to the first electrode 13 of the neighboring photovoltaic cell. A similar approach may be used related to the second plate electrode 132 at the second edge of the photovoltaic plate.

Figure 9:
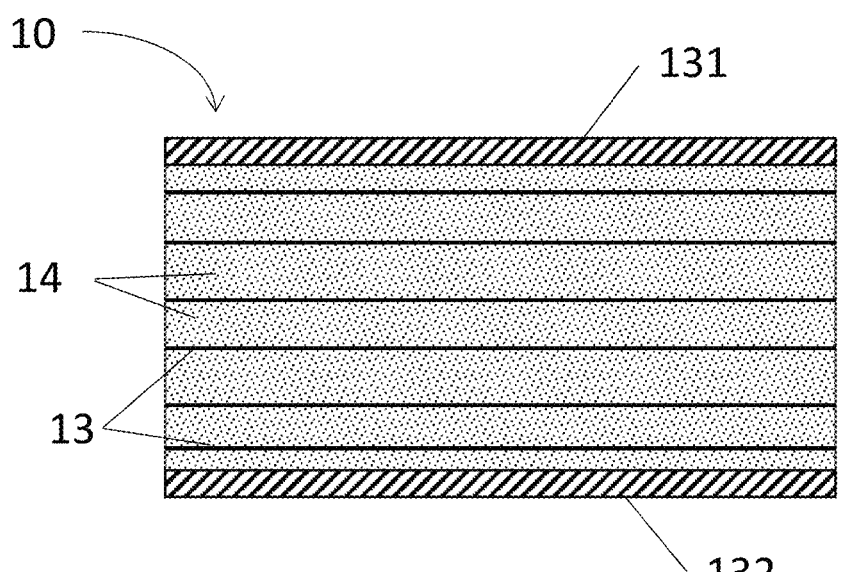
FIG. 9 schematically shows an example of a top view of a photovoltaic plate having a first plate electrode and a second plate electrode, according to example embodiments.

FIG. 9 schematically shows an example of a top view of a photovoltaic plate 10 having a first plate electrode 131 and a second plate electrode 132, first cell electrodes 13 and second cell electrodes 14.

In embodiments of the present disclosure, the method 100 further comprises providing (FIG. 1, step 102) a connection element comprising a plurality of electrically conductive wires, e.g. ribbons, arranged in a grid structure on a surface of each of the plurality of thin-film photovoltaic plates, wherein the connection element is electrically insulated from the first cell electrodes 13 and from the second cell electrodes 14 of the plurality of photovoltaic cells 15. In other embodiments, a single connection element comprising a plurality of electrically conductive wires arranged in a grid structure may be provided on two or more thin-film photovoltaic plates positioned next to each other side by side, i.e. a single connection element may substantially cover two or more thin-film photovoltaic plates. For example, a single connection element may be provided on all thin-film photovoltaic plates positioned next to each other side by side.

Figure 8:
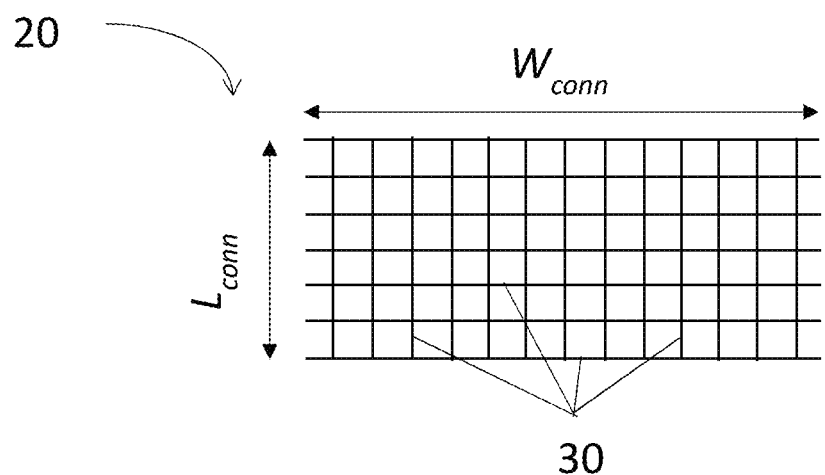
FIG. 8 schematically shows an example of a connection element comprising a plurality of electrically conductive wires arranged in a grid structure, according to example embodiments.

FIG. 8 schematically shows an example of a connection element 20 comprising a plurality of electrically conductive wires 30 arranged in a grid structure in accordance with an embodiment of the present disclosure. The connection element 20 has a width $W_{conn}$ and a length $L_{conn}$. In embodiments, the width $W_{conn}$ and/or the length $L_{conn}$ may for example be substantially the same as respectively the width $W_{plate,cut}$ and/or the length $L_{plate}$ of the corresponding thin-film photovoltaic plate 10. In embodiments, the width $W_{conn}$ and/or the length $L_{conn}$ may be different from, for example slightly different from (for example having a difference in size of a few mm or less, the present disclosure not being limited thereto), respectively the width $W_{plate,cut}$ and/or the length $L_{plate}$ of the corresponding thin-film photovoltaic plate 10. The connection element 20 may for example be a woven fabric or an expanded metal mesh, the present disclosure not being limited thereto. In the further description, where reference is made to connection elements comprising a plurality of electrically conductive wires, it is understood that this also includes for example connection elements comprising a plurality of electrically conductive ribbons, such as for example expanded metal meshes. In particular embodiments the electrically conductive wires, e.g. ribbons, 30 are made of a solderable material or at least partially coated with a solderable material.

In the example shown in FIG. 8 the plurality of electrically conductive wires 30 is arranged in a regular grid structure comprising a plurality of substantially straight electrically conductive wires, part of the electrically conductive wires being oriented in a direction corresponding to the width direction of the connection element and being provided substantially parallel to each other and at substantially equal distance from each other, and another part of the electrically conductive wires being oriented in a direction corresponding to the length direction of the connection element and being provided substantially parallel to each other and at substantially equal distance from each other. However, this is only an example and other grid arrangements may be used. For example, the electrically conductive wires may be provided along different orientations, e.g. non-parallel to each other, they may be provided at non-equal distances from each other, and/or they may be non-straight, such as curved or wavy, the present disclosure not being limited thereto. The plurality of electrically conductive wires may be arranged in a regular pattern or in an irregular pattern.

In some embodiments of the present disclosure the plurality of electrically conductive wires 30 may have dimensions that are sufficiently small to make them "invisible" or "nearly invisible" to the naked eye, but sufficiently large to obtain a connection element having a suitable, sufficiently low, electrical resistance. In some embodiments of the present disclosure the plurality of electrically conductive wires 30 may be provided with a distance between neighboring wires that allow realizing a substantial transparency of the connection element 20, such as for example a transparency larger than 90%, for example larger than 95%, for example larger than 98%. "Nearly invisible" electrically conductive wires may for example refer to wires having a width (i.e. a size corresponding to a width of their projection onto a surface substantially parallel to a surface of the connection element 20) in the order of 250 micrometer or less, for example in the range between 50 micrometers and 250 micrometers, for example between 80 micrometers and 120 micrometers, the present disclosure not being limited thereto. In some embodiments of a method of the present disclosure, outer wires of the connection element 20 (i.e. electrically conductive wires that are to be connected to a first plate electrode 131 and/or a second plate electrode 132) may have a larger width than the other electrically conductive wires, the present disclosure not being limited thereto. A distance between neighboring electrically conductive wires may for example in the range between 0.3 cm and 3 cm, for example between 0.5 cm and 2 cm, such as for example between 1 cm and 1.5 cm, the present disclosure not being limited thereto. A suitable electrical resistance of a connection element may for example refer to a connection element having a sheet resistance lower than 10 Ohm per square, lower than 2 Ohm per square, lower than 0.5 Ohm per square, or lower than 0.1 Ohm per square, the present disclosure not being limited thereto.

Figure 10:
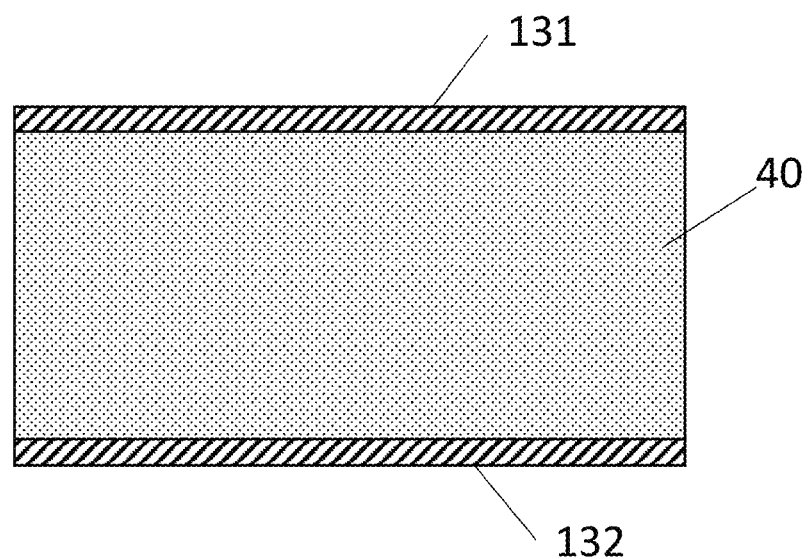
FIG. 10 schematically shows an example (top view) of a photovoltaic plate with an optically transparent electrically insulating layer positioned thereon, according to example embodiments.
Figure 11:
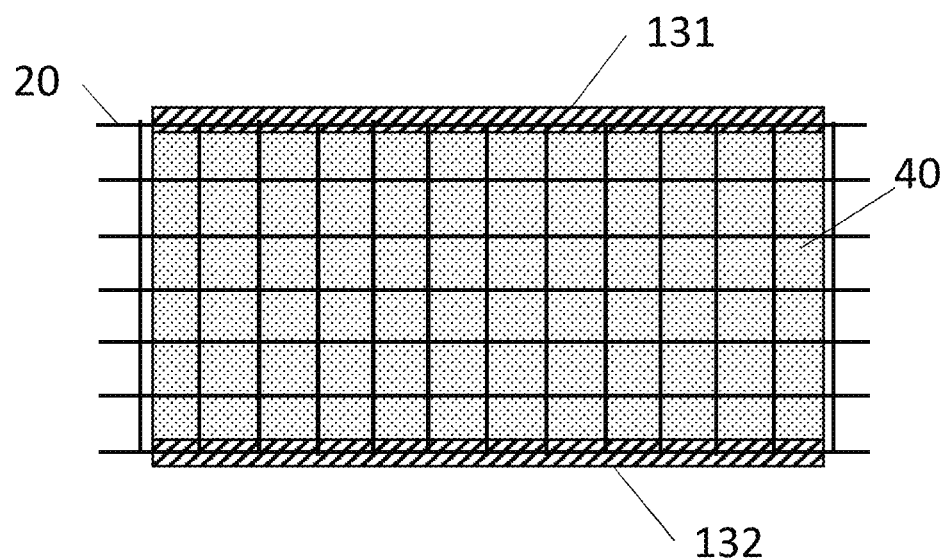
FIG. 11 schematically illustrates an example (top view) of a connection element being provided on a thin-film photovoltaic plate, according to example embodiments.
Figure 12:
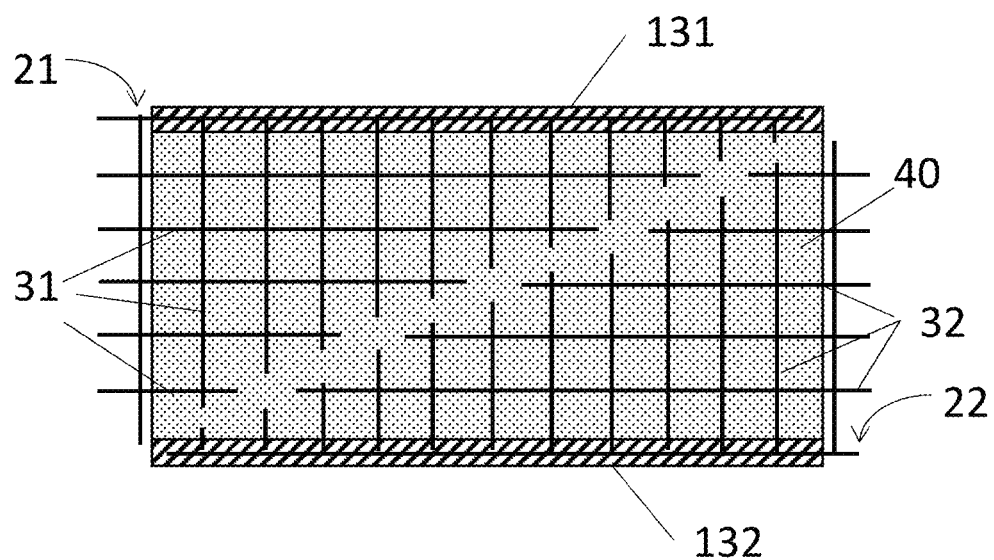
FIG. 12 schematically illustrates an example (top view) of the structure of FIG. 11 after division of the connection element into a first connection part and a second connection part, according to example embodiments.

FIG. 9 schematically shows an example of a top view of a photovoltaic plate 10 having a first plate electrode 131 and a second plate electrode 132, as may be used in a method 100 according to an embodiment of the present disclosure. FIG. 11 schematically illustrates an example (top view) of a connection element 20 being provided on a surface of the thin-film photovoltaic plate 10 shown in FIG. 9, in accordance with an embodiment of the present disclosure. In embodiments of the present disclosure, before providing the connection element 20 (FIG. 1, step 102) on the thin-film photovoltaic plate 10, first an optically transparent electrically insulating layer 40 may be provided on the photovoltaic plate 10 to avoid electrical shorts between the connection element 20 and the first cell electrodes 13 and second cell electrodes 14 of the plurality of photovoltaic cells 15, i.e. to establish an electrical insulation between the connection element 20 and the plurality of first cell electrodes 13 and second cell electrodes 14 of the underlying thin-film photovoltaic plate 10. This is schematically illustrated in FIG. 10, showing an example (top view) of a photovoltaic plate 10 with an electrically insulating layer 40 positioned thereon, thereby leaving the first plate electrode 131 and the second plate electrode 132 exposed, i.e. non-covered, at least partially, to enable electrical contacting in a further process step. The electrically insulating layer 40 may be made of a sufficiently soft material to avoid damage, such as mechanical damage, to the underlying photovoltaic plate 10 and it may be optically translucent, e.g. optically transparent. Examples of materials that may be used for the electrically insulating layer 40 are EVA (Ethylene Vinyl Acetate), PVB (PolyVinyl Butyral), a polyolefin material, a silicone material, PET (PolyEthylene Terephthalate) or PMMA (Poly(Methyl MethAcrylate)), the present disclosure not being limited thereto.

FIG. 11 schematically illustrates at top view of a photovoltaic plate 10 having an electrically insulating layer 40 on its front surface, with a connection element 20 being provided on the electrically insulating layer 40. In the example shown, the connection element 20 has a size that is slightly larger (in both the width and length direction) than the underlying electrically insulating layer 40, so as to enable forming in a further process step a first electrical connection between a first connection part of the connection element 20 on one hand and the first plate electrode and a first busbar (as described below) on the other hand, and between a second connection part of the connection element 20 at one hand and the second plate electrode and a second busbar (as described below) on the other hand in a later process step, as further described.

In the example illustrated in FIG. 11, the connection element 20 is provided on the photovoltaic plate 10 in a predetermined position such that an electrically conductive wire is provided on the first plate electrode 131, i.e. aligned with the first plate electrode 131, and another electrically conductive wire is provided on the second plate electrode 132, i.e. aligned with the second plate electrode 132. However, this is only an example and the present disclosure is not limited thereto.

In a next step (FIG. 1, step 103) of a method according to the first aspect of the present disclosure each connection element 20 is physically separated into a first connection part 21 comprising a plurality of first electrically interconnected conductive wires 31 and a second connection part 22 comprising a plurality of second electrically interconnected conductive wires 32. Physically separating a connection element 20 into a first connection part 21 and a second connection part 22 results in the first connection part 21 and the plurality of first electrically interconnected conductive wires 31 being electrically insulated from the second connection part 22 and the plurality of second electrically interconnected conductive wires 32. Physically separating a connection element 20 may comprise providing an interruption of the electrically conductive wires along a predetermined line, for example by cutting, by laser ablation or by any other suitable method.

In embodiments of the present disclosure an electrically conductive connection element 20 may be provided on the electrically insulating layer 40 before its division into a first connection part 21 and a second connection part 22. The connection element 20 may have substantially the same dimensions as the dimensions of the underlying insulating layer 40, or it may have slightly different dimensions. After positioning the connection element 20 on the electrically insulating layer 40, e.g., such that the connection element 20 is substantially aligned with the electrically insulating layer 40, the connection element may be physically separated into a first connection part 21 and a second connection part 22. After physically separating, in embodiments, the first connection part 21 and the second connection part may be moved (shifted) over a suitable distance, such as for example over a distance of a few mm, for example both in a width direction and in a length direction, such that they are separated from each other.

In other embodiments of the present disclosure an electrically conductive connection element 20 may be physically separated into a first connection part 21 and a second connection part 22 before it is provided on the electrically insulating layer 40.

In embodiments of the present disclosure, after shifting and separation of the first connection part 21 and the second connection part 22, and after their positioning on a surface of a photovoltaic plate 10, at least one first electrically interconnected conductive wire 31 may be positioned on (aligned with) the corresponding first plate electrode 131 and/or at least one second electrically interconnected conductive wire 32 may be positioned on (aligned with) the corresponding second plate electrode 132, for example to allow forming a first electrical connection and/or a second electrical connection by direct soldering, welding, gluing or pressing. In other embodiments of a method of the present disclosure the first connection part 21 may be positioned non-aligned with the first plate electrode 131 and/or the second connection part 22 may be positioned non-aligned with the second plate electrode 132 after their separation. In such embodiments, forming a first electrical connection and/or forming a second electrical connection may for example comprise providing an electrically conductive structure such as an electrically conductive strip or an electrically conductive grid in between, the present disclosure not being limited thereto. In embodiments of the present disclosure this may comprise for example attaching an electrically conductive structure by soldering, welding, gluing or pressing, the present disclosure not being limited thereto. In embodiments of the present disclosure this may comprise for example depositing an electrically conductive structure, such as for example by printing a patterned layer comprising an electrically conductive ink, such as, for example, using ink jet printing or screen printing, the present disclosure not being limited thereto. In embodiments of the present disclosure an electrically conductive structure may be provided for forming a first electrical connection between at least one first electrically conductive wire and the first plate electrode and/or for forming a second electrical connection between at least one second electrically interconnected conductive wire and the second plate electrode.

In embodiments of the present disclosure the steps of providing the optically transparent electrically insulating layer 40 and providing the connection element 20 may be combined into a single step, i.e. the electrically insulating layer 40 and the connection element 20 may be provided simultaneously. For example, a structure comprising an electrically insulating layer 40 with a connection element 20 (e.g. already separated into a first connection part 21 and a second connection part 22) provided thereon, attached thereto or integrated therewith may be provided on a surface of the plurality of thin-film photovoltaic plates. In such embodiments, the connection element 20 may for example comprise a grid of electrically conductive lines that may for example be printed or plated on the optically transparent electrically insulating layer 40, the present disclosure not being limited thereto. In order to provide an electrical insulation between a connection element 20 and the first cell electrodes 13 and second cell electrodes 14 of the underlying photovoltaic plate 10, providing such a structure on the photovoltaic plates is done in such a way that the connection element 20 is not in electrical contact with the first cell electrodes 13 or with the second cell electrodes 14, e.g. in such a way that electrically insulating material is present between the first cell electrodes 12 and the second cell electrodes 14 at the one hand and the connection element 20 at the other hand.

Figure 13:
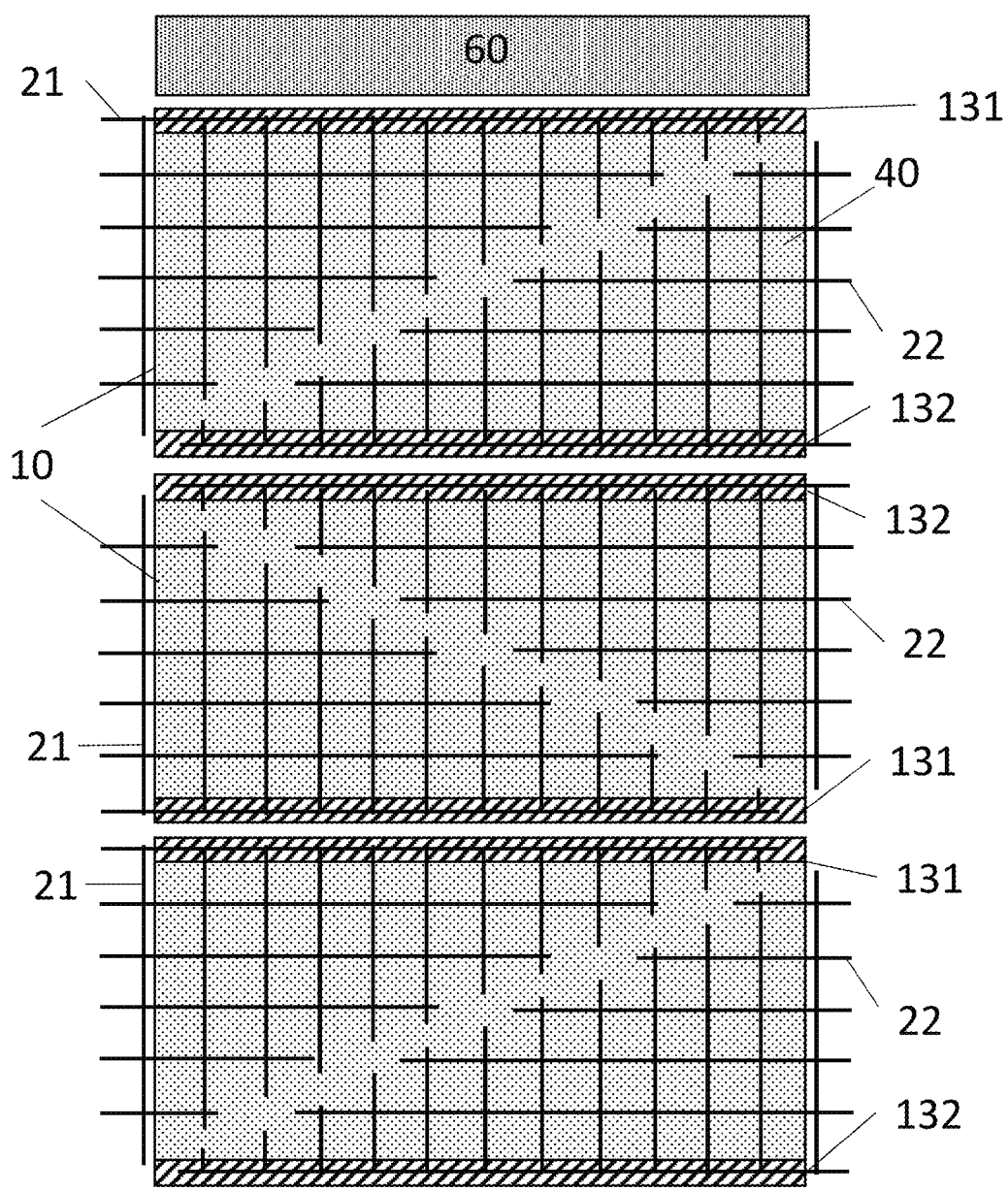
FIG. 13 schematically illustrates an example (top view) of a plurality of photovoltaic plates positioned next to each other side by side, each photovoltaic plate having a first connection element and a second connection element being provided on a surface, according to example embodiments.

FIG. 13 schematically illustrates an example (top view) of a plurality of photovoltaic plates 10 (three photovoltaic plates 10 in the example shown), with a connection element (physically separated into a first connection part 21 and a second connection part 22) being provided on a surface of each of the plurality of photovoltaic plates separately, in accordance with an embodiment of the present disclosure. In this example for each of the plurality of thin-film photovoltaic plates 10 a separate connection element 20 is provided (each being physically separated in a first connection part 21 and a second connection part 22). However, the present disclosure is not limited thereto, and in other embodiments a single connection element 20 may extend over more than one photovoltaic plate 10. In such embodiments, a single first connection part 21 may extend over two or more neighboring photovoltaic plates, and/or a single second connection part 22 may extend over two or more neighboring photovoltaic plates.

As illustrated in FIG. 13, the plurality of photovoltaic plates 10 is placed next to each other side by side. In the example shown in FIG. 13 the plurality of photovoltaic plates 10 is positioned such that a first plate electrode 131 of a photovoltaic plate 10 is located next to a first plate electrode 131 of a neighboring photovoltaic plate and/or such that a second plate electrode 132 of a photovoltaic plate 10 is located next to a second plate electrode 132 of a neighboring photovoltaic plate. However, the present disclosure is not limited thereto, and other ways of positioning or orienting the plurality of photovoltaic plates with respect to each other may be used.

Figure 16:
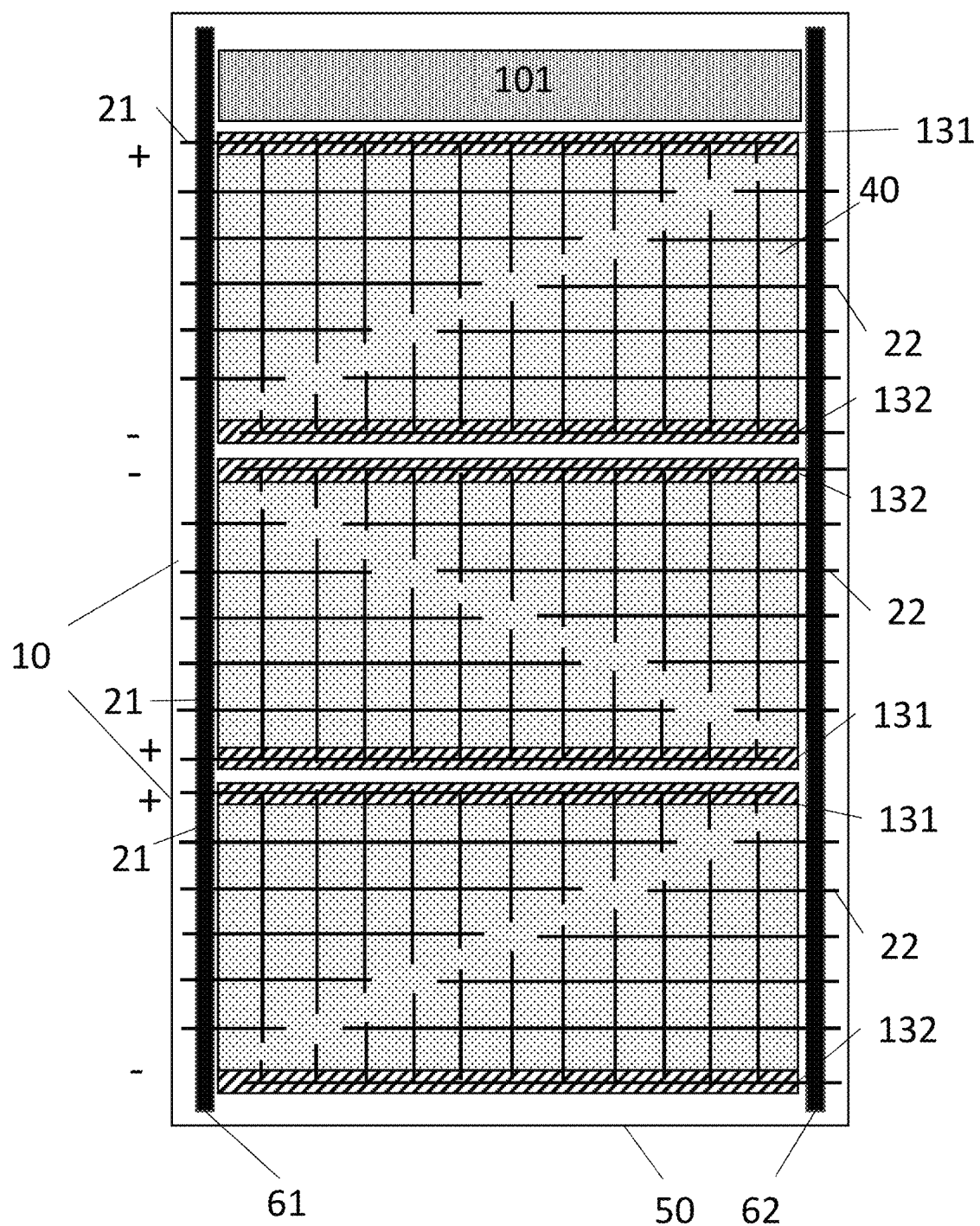
FIG. 16 schematically illustrates an example (top view) of a plurality of thin-film photovoltaic plates being positioned next to each other side by side on a first encapsulation sheet having a first busbar and a second busbar, according to example embodiments.

In the example shown, further a dummy element 60 is positioned next to the plurality of photovoltaic plates 10. In embodiments of the present disclosure a dummy element 60 may be provided optionally, for example for obtaining a predetermined total size of a photovoltaic module. The dummy element 60 may have substantially the same look as the photovoltaic plates 10, for example it may be a piece of a photovoltaic plate (not to be electrically interconnected with the plurality of photovoltaic plates 10) or it may have a look different from the look of the plurality of photovoltaic plates. Although in FIG. 13 (and similarly in FIG. 14, FIG. 16 and FIG. 17) the plurality of plates 10 are schematically shown spaced apart, they may be positioned closer to each other, e.g. with substantially no spacing therein between, for example to obtain a more uniform global appearance. In embodiments of the present disclosure wherein a spacing is present between the plurality of photovoltaic plates, a filling material such as for example a material as used for the electrically insulating layer 40, or for example a silicone material, e.g., a material with a visual appearance similar to or substantially equal to the visual appearance of the electrically insulating layer 40, may be provided in spaces between neighboring photovoltaic plates.

Figure 14:
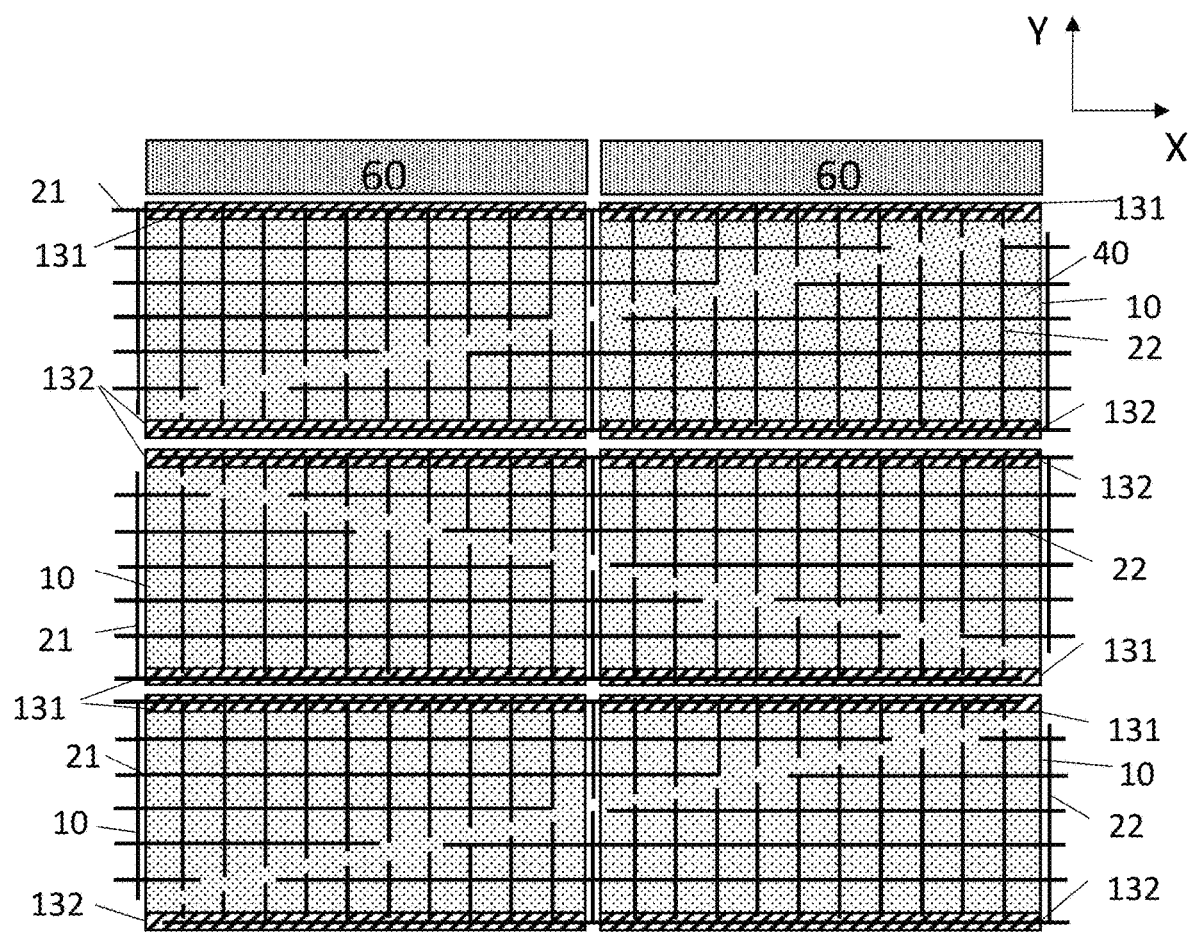
FIG. 14 schematically illustrates an example (top view) of a plurality of photovoltaic plates positioned next to each other side by side and arranged in a two-dimensional array, each photovoltaic plate having a first connection element and a second connection element being provided on a surface, according to example embodiments.

FIG. 14 schematically illustrates another example (top view) of a plurality of photovoltaic plates (six photovoltaic plates 10 in the example shown), each having a first connection part 21 and a second connection part 22 being provided on a first surface in accordance with an embodiment of the present disclosure. In the example shown in FIG. 14 the first connection parts 21 and the second connection parts 22 extend over two neighboring photovoltaic plates 10, the present disclosure not being limited thereto. In the example shown in FIG. 14, the plurality of photovoltaic plates 10 is arranged side by side, in a two-dimensional array. This is only an example, and other arrangements of the plurality of photovoltaic plates may be used, for example for obtaining a predetermined size and/or a predetermined shape of a thin-film photovoltaic module to be fabricated.

In particular embodiments, the plurality of photovoltaic plates 10 is electrically interconnected in parallel, the present disclosure not being limited thereto. For example, in other embodiments the plurality of photovoltaic plates 10 may be electrically interconnected in series or a combination of series and parallel interconnections may be used.

In embodiments wherein the plurality of photovoltaic plates 10 is arranged in a two-dimensional array (as for example schematically illustrated in FIG. 14) different approaches may be used for establishing a parallel electrical interconnection of the plurality of photovoltaic plates 10. For example, the photovoltaic plates 10 arranged in a single "row" (corresponding to the X-direction indicated in FIG. 14) of plates may have a same orientation, i.e. their first plate electrodes 131 may be located next to each other in each other's extension and their second plate electrodes 132 may be located next to each other in each other's extension. In such approach, a single connection element 20 may be used for the photovoltaic plates 10 that are arranged in a same "row" of plates 10, the connection element 20 extending over at least two, e.g. over all photovoltaic plates 10 in the row. After physically separating such connection element 20 in a first connection part 21 and a second connection part 22, a first electrical connection may be formed between the first connection part 21 and the first plate electrodes 131 of the photovoltaic plates arranged in a row, and a second electrical connection may be formed between the second connection part 22 and the second plate electrodes 132 of the photovoltaic plates arranged in the row. This is schematically illustrated in FIG. 14. However, this is only an example and the present disclosure is not limited thereto.

In step 104 (FIG. 1) a first electrical connection is formed for each thin-film photovoltaic plate 10 between its first plate electrode 131 and the corresponding first electrically interconnected conductive wires 31 (or in other words: between the first plate electrode 131 and the corresponding first connection part 21), i.e. between the first plate electrode and the first electrically interconnected conductive wires of the first connection part being provided on the thin-film photovoltaic plate. Further, in step 105 (FIG. 1) a second electrical connection is formed for each thin-film photovoltaic plate 10 between its second plate electrode 132 and the corresponding second electrically interconnected conductive wires 32 (or in other words: between the second plate electrode 132 and the corresponding second connection part 22), i.e. between the second electrode and the second electrically interconnected conductive wires of the second connection part being provided on the thin-film photovoltaic plate. Establishing a first electrical connection and/or a second electrical connection may comprise soldering, welding, gluing, pressing and/or printing, the present disclosure not being limited thereto.

Step 106 (FIG. 1) of a method 100 according to an embodiment of the present disclosure comprises providing a first electrically conductive busbar of the first polarity and a second electrically conductive busbar of the second polarity. This is followed by forming (FIG. 1, step 107) for each of the plurality of thin-film photovoltaic plates 10 a first electrical busbar connection between the corresponding first connection part 21 and the first busbar and forming (FIG. 1, step 107) for each of the plurality of thin-film photovoltaic plates 10 a second electrical busbar connection between the corresponding second connection part 22 and the second busbar.

Figure 15:
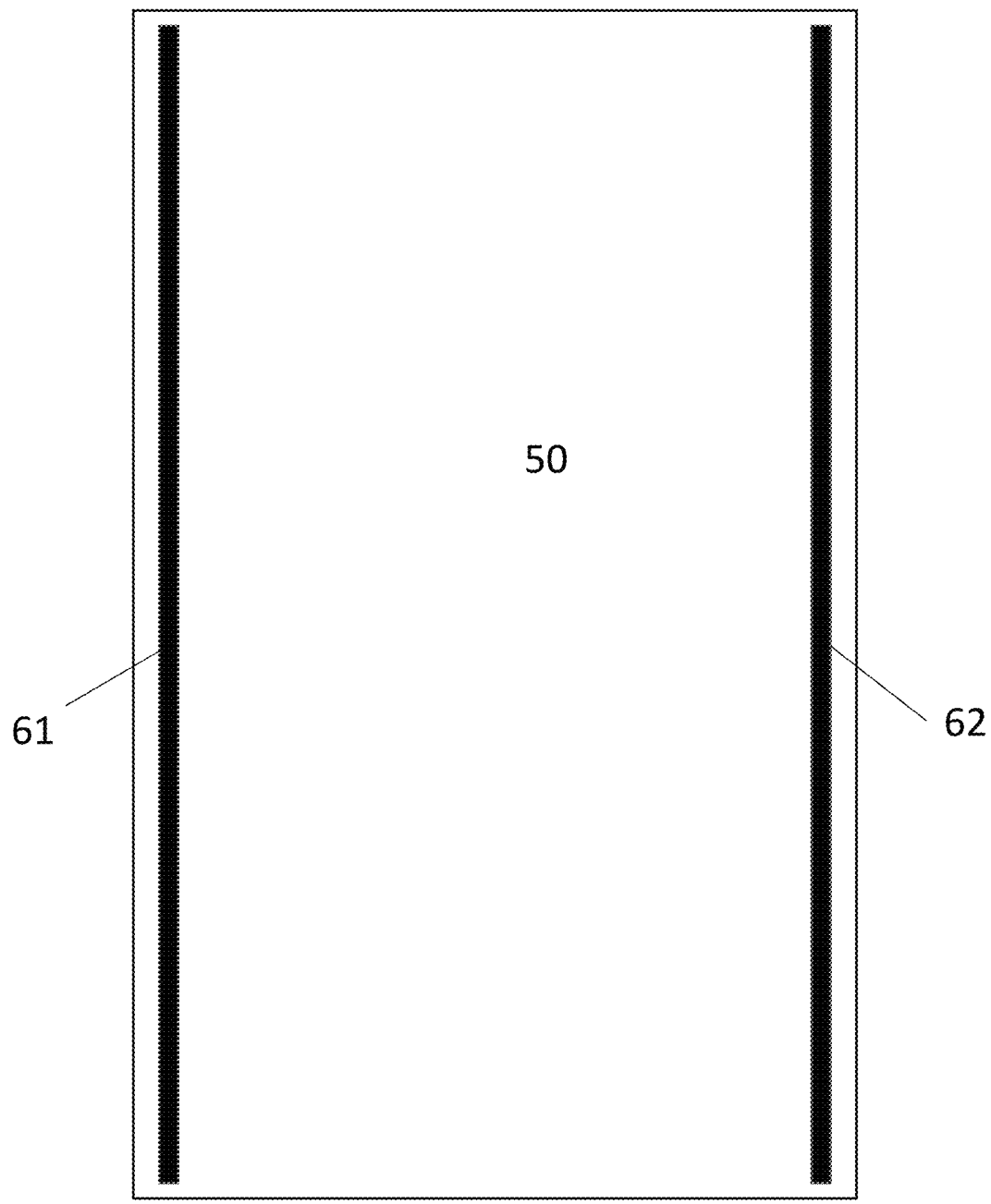
FIG. 15 schematically illustrates an example of a first encapsulation sheet (top view) having a first busbar and a second busbar provided thereon, as may be used in a method according to example embodiments.
Figure 17:
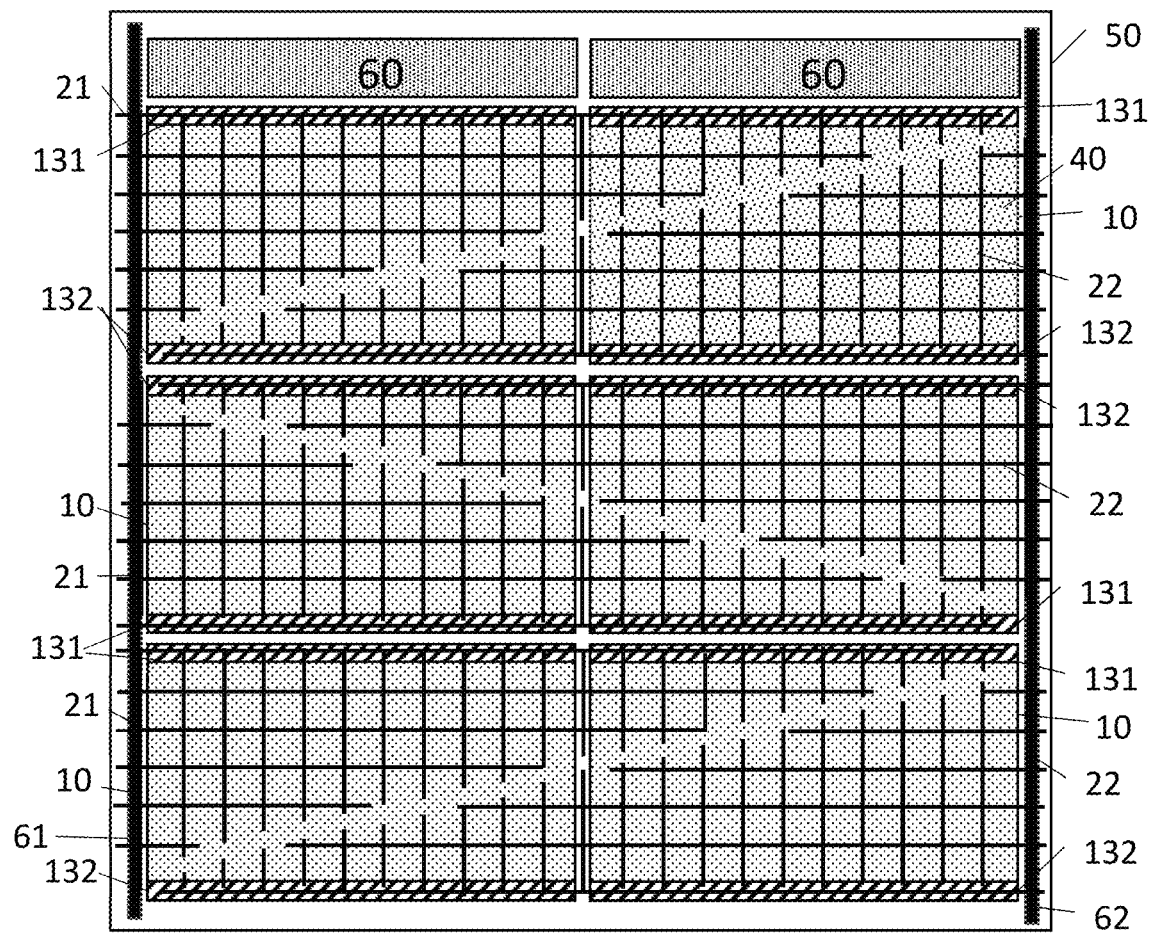
FIG. 17 schematically illustrates an example (top view) of a plurality of thin-film photovoltaic plates being positioned next to each other side by side on a first encapsulation sheet having a first busbar and a second busbar, the plurality of thin-film photovoltaic plates being arranged in a two-dimensional array, according to example embodiments.

In embodiments of the present disclosure, providing the first busbar and the second busbar may for example comprise providing a first encapsulation sheet, such as a for example a glass sheet, having formed on a surface thereof a first busbar and a second busbar at predetermined locations. FIG. 15 schematically illustrates an example of a first encapsulation sheet 50 (top view) having a first busbar 61 and a second busbar 62 provided thereon, as may be used in a method according to embodiments of the present disclosure. In order to enable forming a first electrical busbar connection between first connection part 21 and the first busbar 61 at one hand and forming a second electrical busbar connection between second connection part 22 and the second busbar 62 at the other hand, the plurality of photovoltaic plates 10 may be positioned on the first encapsulation sheet 50 as for example schematically illustrated in FIG. 16 for a configuration corresponding to the photovoltaic plate arrangement shown in FIG. 13. FIG. 17 schematically illustrates an embodiment wherein a plurality of photovoltaic plates is arranged in accordance with the configuration shown in FIG. 14 and positioned on a first encapsulation sheet 50 containing a first busbar 61 and a second busbar 62.

In embodiments of the present disclosure, after shifting and separation of the first connection part 21 and the second connection part 22, after their positioning on a photovoltaic plate 10, and after providing a first busbar 61 and a second busbar 62, at least one first electrically conductive wire 31 may be positioned on (aligned with) the corresponding first busbar 61 and/or at least one second electrically conductive wire 32 may be positioned on (aligned with) the corresponding second busbar 62, for example to allow forming a first electrical busbar connection and/or a second electrical busbar connection by direct soldering, welding, gluing or pressing. In other embodiments of a method of the present disclosure a first connection part 21 may be positioned non-aligned with the first busbar 61 and/or a second connection part 22 may be positioned non-aligned with the second busbar 62 after their separation. In such embodiments forming a first electrical busbar connection and/or forming a second electrical busbar connection may for example comprise providing an electrically conductive structure such as an electrically conductive strip or an electrically conductive grid in between, the present disclosure not being limited thereto. In embodiments of the present disclosure this may comprise for example attaching an electrically conductive structure by soldering, welding, gluing or pressing, the present disclosure not being limited thereto. In embodiments of the present disclosure this may comprise for example depositing an electrically conductive structure, such as for example by printing a patterned layer comprising an electrically conductive ink, such as, for example, by using ink jet printing or screen printing, the present disclosure not being limited thereto. In embodiments of the present disclosure an electrically conductive structure may be provided for forming a first electrical busbar connection between at least one first electrically conductive wire 31 and the first busbar 61 and/or forming a second electrical busbar connection between at least one second electrically conductive wire 32 and the second busbar 62.

The first busbar 61 and the second busbar 62 may for example comprise or consist of an electrically conductive rod, e.g. a full, solid rod or a hollow rod, an electrically conductive strip or an electrically conductive wire, the present disclosure not being limited thereto. The first busbar 61 and the second busbar 62 comprise an electrically conductive material, e.g., a metal such as Al or Cu, the present disclosure not being limited thereto, coated with a solderable material or a weldable material. The first busbar 61 and the second busbar 62 are provided to enable further, external electrical connections of a photovoltaic module comprising the plurality of photovoltaic plates 10 according to an embodiment of the third aspect of the present disclosure, to another element such as for example another photovoltaic module. In embodiments of the present disclosure wherein the first busbar 61 and/or the second busbar comprise or consist of an electrically conductive rod, the first and/or second busbar may further have a mechanical function, e.g. they may reinforce the photovoltaic module.

Figure 2:
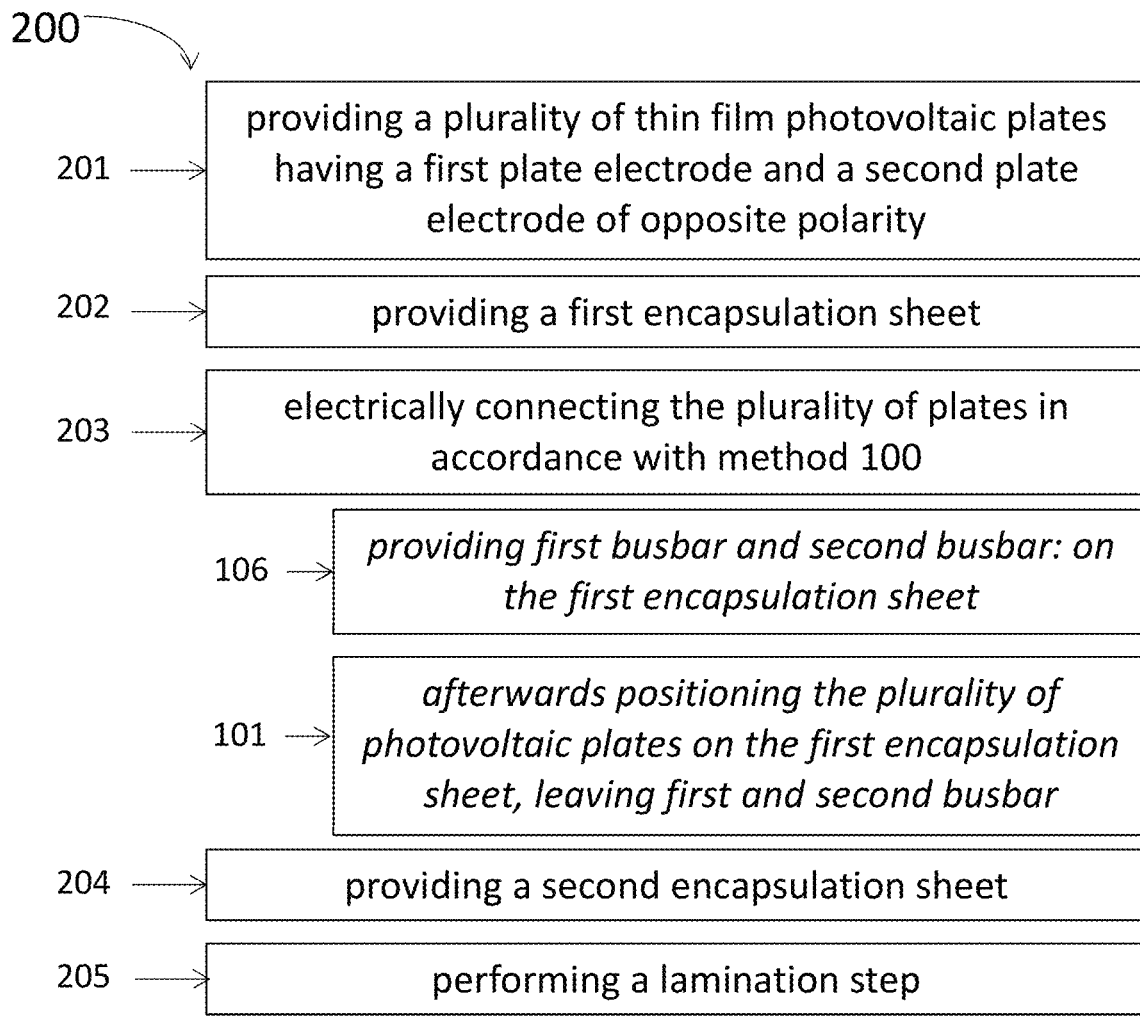
FIG. 2 illustrates an example of process steps of a method for manufacturing a thin-film photovoltaic module, according to example embodiments.

According to a second aspect, the present disclosure relates to a method for manufacturing a thin-film photovoltaic module. An example of a method 200 according to an embodiment of the second aspect of the present disclosure is schematically illustrated in FIG. 2. The method 200 comprises: providing (FIG. 2, step 201) a plurality of thin-film photovoltaic plates comprising a first plate electrode of a first polarity and a second plate electrode of a second polarity opposite to the first polarity; providing (FIG. 2, step 202) a first encapsulation sheet, e.g. a first glass sheet; electrically interconnecting (FIG. 2, step 203) the plurality of thin-film photovoltaic plates by a method 100 according to an embodiment in accordance with the first aspect of the present disclosure, wherein providing (FIG. 1, step 106) the first busbar of the first polarity and the second busbar of the second polarity comprises providing the first busbar and the second busbar on the first encapsulation sheet and wherein positioning (FIG. 1, step 101) the plurality of thin-film photovoltaic plates next to each other side by side comprises positioning the plurality of thin-film photovoltaic plates on the first encapsulation sheet, thereby leaving the first busbar and the second busbar exposed; providing (FIG. 2, step 204) a second encapsulation sheet, e.g. second glass sheet, on the plurality of thin-film photovoltaic plates at a side opposite to the side of the first encapsulation sheet; and performing a lamination step (FIG. 2, step 205) to thereby encapsulate the plurality of thin-film photovoltaic plates in between the first encapsulation sheet and the second encapsulation sheet, to thereby protect the plurality of thin-film photovoltaic plates against mechanical damage and/or undesired environmental influences and to thereby form a thin-film photovoltaic module.

In embodiments of the present disclosure the first encapsulation sheet may correspond to a back encapsulation sheet of the photovoltaic module and the second encapsulation sheet may correspond to a front encapsulation sheet of the photovoltaic module or, vice versa, the first encapsulation sheet may correspond to a front encapsulation sheet of the photovoltaic module and the second encapsulation sheet may correspond to a rear encapsulation sheet of the photovoltaic module.

In embodiments of a method 200 according to the second aspect of the present disclosure, electrically interconnecting the plurality of thin-film photovoltaic plates (FIG. 2, step 203) is performed in accordance with a method 100 according to the first aspect of the present disclosure, wherein providing (FIG. 1 step 106) the first busbar of the first polarity and the second busbar of the second polarity comprises providing (FIG. 2 step 106) the first busbar and the second busbar on a first encapsulation sheet, as described above and as for example illustrated in FIG. 16 and FIG. 17, and wherein positioning (FIG. 1 step 101) the plurality of thin-film photovoltaic plates next to each other side by side comprises positioning (FIG. 2 step 101) the plurality of thin-film photovoltaic plates on the first encapsulation sheet having the first busbar and the second busbar provided thereon, thereby leaving the first busbar and the second busbar exposed, as described above and as for example illustrated in FIG. 16 and FIG. 17.

A method according to embodiments of the second aspect of the present disclosure may further comprise providing an encapsulation layer comprising an encapsulation material (encapsulant) in between the plurality of thin-film photovoltaic plates and at least one of the first encapsulation sheet and the second encapsulation sheet.

In embodiments according to the second aspect of the present disclosure, instead of providing a dedicated first encapsulation sheet or instead of providing a dedicated second encapsulation sheet, such an encapsulation plate may be omitted and the substrate 11 of the photovoltaic plates 10 may have the function of a first or second encapsulation sheet. In such embodiments, the first busbar 61 and the second busbar 62 may for example be provided on a supporting substrate, such as for example on an electrically insulating foil. Such embodiments may lead to cheaper, thinner and/or lighter photovoltaic modules and to a reduced module cost.

In embodiments of the present disclosure, the plurality of photovoltaic plates 10 within a photovoltaic module may be electrically interconnected in parallel, the present disclosure not being limited thereto.

In embodiments of a method according to the second aspect of the present disclosure, before providing the second encapsulation sheet, e.g. second glass sheet, on the plurality of thin-film photovoltaic plates, and after forming the first electrical busbar connection and the second electrical busbar connection, an encapsulant (encapsulation layer, such as for example a layer comprising EVA, PVB, Polyolefin or a silicone) may be provided on the plurality of thin-film photovoltaic plates, e.g., fully covering the surface of the plurality of thin-film photovoltaic plates. This may be followed by a lamination step to thereby attach the second encapsulation sheet to the plurality of photovoltaic plates, with the encapsulation material therein between.

The lamination step typically comprises heating, to induce flowing of the encapsulation material. In some embodiments of the present disclosure this heating step may simultaneously result in the formation of first electrical connections and/or second electrical connections and/or first electrical busbar connections and/or second electrical busbar connections, for example by soldering. In such embodiments, performing the heating process may comprise performing a first heating step at a first temperature and afterwards performing a second heating step at a second temperature, the second temperature being higher than the first temperature. The first temperature may be selected to enable soldering, to thereby form first electrical connections and/or second electrical connections and/or first electrical busbar connections and/or second electrical busbar connections. The second temperature may be selected to enable melting of the encapsulation material. For example, the first temperature may be in the range between 120° C. and 240° C. and the second temperature may be 10° C. to 50° C. higher than the first temperature, the present disclosure not being limited thereto.

In embodiments according to the second aspect of the present disclosure, the three steps of providing a connection element 20, providing an electrically insulating layer 40, and providing an encapsulation layer may be combined into two steps or into a single step.

For example, in embodiments according to the second aspect of the present disclosure, first an electrically insulating layer 40 may be provided on the plurality of photovoltaic plates 10. Next, an encapsulation layer having a connection element 20 attached thereto or integrated therewith may be provided on the electrically insulating layer 40. In such embodiments, separating the connection element 20 into a first connection part 21 and a second connection part 22 may be done before attaching it to or integrating it with the encapsulation layer. In other embodiments, separating the connection element 20 into a first connection part 21 and a second connection part 22 may be done after attaching it to or integrating it with the encapsulation layer. In some embodiments where the connection element 20 is integrated with or attached to a carrier, such as an encapsulation layer or for example an encapsulation sheet, that it may ease processing and handling of the connection element 20 and/or it may improve its dimensional stability.

In other embodiments according to the second aspect of the present disclosure the electrically insulating layer 40 and the connection element 20 may be combined, i.e. the connection element 20 may be attached to or integrated with the electrically insulating layer 40 before their positioning on the plurality of photovoltaic plates, as described above in relation to an embodiment according to the first aspect of the present disclosure.

In other embodiments of the second aspect of the present disclosure, the electrically insulating layer 40, the connection element 20 and a layer of encapsulation material may be combined into a single structure (e.g. a single sheet) before their positioning on the plurality of photovoltaic plates 10. In such embodiments, the electrically insulating layer 40 and the encapsulation material may be different layers or they may be formed by a single layer, i.e. the electrically insulating layer 40 may also be used as an encapsulant.

In other embodiments of the second aspect of the present disclosure the connection element 20 may be provided on the second encapsulation sheet.

In embodiments of methods of the present disclosure, a connection element 20 may be provided on a surface of the plurality of photovoltaic plates 10 at a side corresponding to the side of the photovoltaic cells 15 (i.e. the side opposite to the side of the substrate 11). However, the present disclosure is not limited thereto, and in other embodiments a connection element 20 may be provided on a surface of the plurality of photovoltaic plates corresponding to the side of the substrate 11. In such embodiments, there may be no need for providing an electrically insulating layer 40; in such embodiments, an electrical insulation between the connection element and the cell electrodes may be established by the photovoltaic plate substrate 11 located in between. In such embodiments there is a need for providing a first electrically conductive path between a first plate electrode 131 located at one side of the photovoltaic plates 10 (the side opposite to the side of the substrate 11) and at least one first electrically conductive wire 31 of the first connection part 21 located at an opposite side of the photovoltaic plate (the side of the substrate 11) and for providing a second electrically conductive path between a second plate electrode 132 located at a one side of the photovoltaic plates (the side opposite to the substrate side) and at least one second electrically conductive wire 32 of the second connection part 22 located at the opposite side of the photovoltaic plate (the side of the substrate). Such electrically conductive paths may for example be formed by providing an electrically conductive strip or grid over a lateral edge of the substrate 11 or by printing or depositing a patterned layer comprising an electrically conductive material on a lateral edge of the substrate 11.

In embodiments of the present disclosure, part of the plurality of photovoltaic plates 10 may have a connection element 20 provided on a front surface and another part of the plurality of photovoltaic plates 10 may have a connection element 20 provided on a rear surface.

In a third aspect, the present disclosure relates to thin-film photovoltaic modules. A thin-film photovoltaic module according to embodiments of the third aspect of the present disclosure comprises: a plurality of thin-film photovoltaic plates positioned next to each other side by side, each of the thin-film photovoltaic plates comprising a first plate electrode of a first polarity and a second plate electrode of a second polarity opposite to the first polarity; for each of the plurality of thin-film photovoltaic plates, a connection element comprising a plurality of electrically conductive wires arranged in a grid structure and physically separated into a first connection part comprising a plurality of first electrically interconnected conductive wires and a second connection part comprising a plurality of second electrically interconnected conductive wires, the plurality of first electrically interconnected conductive wires being electrically insulated from the plurality of second electrically interconnected conductive wires; for each of the plurality of thin-film photovoltaic plates, a first electrical connection between corresponding first electrically interconnected conductive wires and the first plate electrode and a second electrical connection between corresponding second electrically conductive wires and the second plate electrode; a first busbar of the first polarity and a second busbar of the second polarity; and for each of the plurality of thin-film photovoltaic plates, a first electrical busbar connection between the corresponding first electrically interconnected conductive wires and the first busbar and a second electrical busbar connection between the corresponding second electrically interconnected conductive wires and the second busbar.

A thin-film photovoltaic module according to embodiments of the present disclosure may be encapsulated, i.e. it may further comprise a front sheet, a back sheet, a front side encapsulation layer and/or a rear side encapsulation layer. It may further comprise a sealing layer and a suitable frame along edges of the module.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

It is to be understood that although particular embodiments, specific constructions and configurations, as well as materials, have been discussed herein for devices according to the present disclosure, various changes or modifications in form and detail may be made without departing from the scope of this disclosure. Steps may be added or deleted to methods described within the scope of the present disclosure.

The invention claimed is:

1. A method for electrically interconnecting a plurality of thin-film photovoltaic plates, wherein the method comprises:
    positioning the plurality of thin-film photovoltaic plates side by side, wherein each of the plurality of thin-film photovoltaic plates is partially translucent or non-translucent and comprises:
        at least one first plate electrode of a first polarity; and
        at least one second plate electrode of a second polarity opposite to the first polarity, wherein the at least one first plate electrode and the at least one second plate electrode are at least partially exposed on a same surface and at opposite edges of the thin-film photovoltaic plate;
    providing at least one connection element on an illumination surface of each of the plurality of thin-film photovoltaic plates, wherein the at least one connection element comprises a plurality of electrically conductive wires arranged in a grid structure, wherein rows of electrically conductive wires are electrically coupled to one another via columns of electrically conductive wires;
    subsequent to providing the at least one connection element on a surface of each of the plurality of thin-film photovoltaic plates, physically separating each connection element into a first connection part comprising a plurality of first electrically interconnected, conductive wires and a second connection part comprising a plurality of second electrically interconnected, conductive wires such that, on a surface of each of the plurality of thin-film photovoltaic plates, the plurality of first electrically interconnected, conductive wires is electrically insulated from the plurality of second electrically interconnected, conductive wires;
    forming, for each of the plurality of thin-film photovoltaic plates, a first electrical connection between corresponding first electrically interconnected conductive wires and the at least one first plate electrode;
    forming, for each of the plurality of thin-film photovoltaic plates, a second electrical connection between corresponding second electrically interconnected conductive wires and the at least one second plate electrode;
    providing a first busbar of the first polarity and a second busbar of the second polarity; and
    forming, for each of the plurality of thin-film photovoltaic plates, a first electrical busbar connection between the corresponding first electrically interconnected, conductive wires and the first busbar and a second electrical busbar connection between the corresponding second electrically interconnected, conductive wires and the second busbar, thereby electrically interconnecting the plurality of thin-film photovoltaic plates.

2. The method according to claim 1, wherein the surface on which the at least one connection element is provided is a front surface for at least one of the plurality of thin-film photovoltaic plates.

3. The method according to claim 1,
    wherein each of the plurality of thin-film photovoltaic plates comprises a plurality of thin-film photovoltaic cells,
    wherein each of the thin-film photovoltaic cells comprises a first cell electrode and a second cell electrode, and
    wherein the method further comprises providing an optically transparent, electrically insulating layer on the surface on which the at least one connection element is provided to thereby electrically insulate the first cell electrodes and the second cell electrodes from the at least one connection element.

4. The method according to claim 3, wherein the optically transparent, electrically insulating layer is provided before providing the at least one connection element.

5. The method according to claim 3,
    wherein the optically transparent, electrically insulating layer and the at least one connection element are provided simultaneously, and
    wherein the at least one connection element is integrated with the optically transparent electrically insulating layer.

6. The method according to claim 1, wherein forming the first electrical connection and forming the second electrical connection comprise welding, soldering, gluing, pressing, printing of an electrically conductive structure, welding of an electrically conductive structure, or soldering of an electrically conductive structure.

7. The method according to claim 1, wherein forming the first electrical busbar connection and forming the second electrical busbar connection comprise welding, soldering, gluing, pressing, printing of an electrically conductive structure, welding of an electrically conductive structure, or soldering of an electrically conductive structure.

8. The method according to claim 1, wherein the at least one connection element has an optical transparency of more than 90%, more than 95%, or more than 98%.

9. The method according to claim 1, wherein the at least one connection element has a sheet resistance lower than 10 Ohm per square, lower than 2 Ohm per square, lower than 0.5 Ohm per square, or lower than 0.1 Ohm per square.

10. A method for manufacturing a thin-film photovoltaic module, wherein the method comprises:
providing a plurality of thin-film photovoltaic plates that are partially translucent or non-translucent and comprise at least one first plate electrode of a first polarity and at least one second plate electrode of a second polarity opposite to the first polarity, wherein the at least one first plate electrode and the at least one second plate electrode are at least partially exposed on a same surface and at opposite edges of the thin-film photovoltaic plate;
providing a first encapsulation sheet;
electrically interconnecting the plurality of thin-film photovoltaic plates by a method according to claim 1,
wherein providing the first busbar of the first polarity and the second busbar of the second polarity comprises providing the first busbar and the second busbar on the first encapsulation sheet,
wherein positioning the plurality of thin-film photovoltaic plates side by side comprises positioning the plurality of thin-film photovoltaic plates on the first encapsulation sheet having the first busbar and the second busbar provided thereon, thereby leaving the first busbar and the second busbar at least partially exposed;
providing a second encapsulation sheet on the plurality of thin-film photovoltaic plates at a side of the thin-film photovoltaic plates opposite to a side of the first encapsulation sheet; and
performing a lamination step to encapsulate the plurality of thin-film photovoltaic plates in between the first encapsulation sheet and the second encapsulation sheet and to form a thin-film photovoltaic module.

11. The method according to claim 10, further comprising providing an encapsulation layer in between the plurality of thin-film photovoltaic plates and at least one of the first encapsulation sheet and the second encapsulation sheet.

12. The method according to claim 11, wherein the at least one connection element is integrated with the encapsulation layer.

13. The method according to claim 11 wherein an optically transparent, electrically insulating layer, the at least one connection element, and the encapsulation layer are integrated into a single sheet.

14. The method according to claim 11, wherein placing the plurality of thin-film photovoltaic plates side by side comprises positioning the plurality of thin-film photovoltaic plates such that plate electrodes of adjacent thin-film photovoltaic plates having same polarity are located next to each other.

15. A thin-film photovoltaic module comprising:
a plurality of thin-film photovoltaic plates positioned side by side, wherein each of the thin-film photovoltaic plates is partially translucent or non-translucent and comprises:
at least one first plate electrode of a first polarity; and
at least one second plate electrode of a second polarity opposite to the first polarity, wherein the at least one first plate electrode and the at least one second plate electrode are at least partially exposed on a same surface and at opposite edges of the thin-film photovoltaic plate;
for each of the plurality of thin-film photovoltaic plates, a connection element provided on an illumination surface thereof,
wherein the connection element comprises a plurality of electrically conductive wires arranged in a grid structure, rows of electrically conductive wires are electrically coupled to one another via columns of electrically conductive wires, and the connection element is physically separated into a first connection part comprising a plurality of first electrically interconnected, conductive wires and a second connection part comprising a plurality of second electrically interconnected, conductive wires, and
wherein the plurality of first electrically interconnected, conductive wires is electrically insulated from the plurality of second electrically interconnected, conductive wires;
for each of the plurality of thin-film photovoltaic plates, a first electrical connection between corresponding first electrically interconnected conductive wires and the at least one first plate electrode and a second electrical connection between corresponding second electrically interconnected conductive wires and the at least one second plate electrode;
a first busbar of the first polarity and a second busbar of the second polarity; and
for each of the plurality of thin-film photovoltaic plates, a first electrical busbar connection between the corresponding first electrically interconnected, conductive wires and the first busbar and a second electrical busbar connection between the corresponding second electrically interconnected, conductive wires and the second busbar.

* * * * *